(12) United States Patent
Salem et al.

(10) Patent No.: US 10,333,477 B2
(45) Date of Patent: Jun. 25, 2019

(54) SWITCHED CAPACITOR HOUSE OF CARDS POWER AMPLIFIER

(71) Applicant: The Regents of the University of California, Oakland, CA (US)

(72) Inventors: Loai Galal Bahgat Salem, La Jolla, CA (US); James F. Buckwalter, La Jolla, CA (US); Patrick P. Mercier, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 15/697,674

(22) Filed: Sep. 7, 2017

(65) Prior Publication Data

US 2018/0097486 A1    Apr. 5, 2018

Related U.S. Application Data

(60) Provisional application No. 62/384,912, filed on Sep. 8, 2016.

(51) Int. Cl.
| | | |
|---|---|---|
| *H03F 1/07* | (2006.01) | |
| *H03F 3/217* | (2006.01) | |
| *H02M 3/158* | (2006.01) | |
| *H03F 3/21* | (2006.01) | |
| *H03F 3/24* | (2006.01) | |
| *H03F 3/72* | (2006.01) | |

(52) U.S. Cl.
CPC ........ *H03F 3/2171* (2013.01); *H02M 3/1582* (2013.01); *H03F 3/211* (2013.01); *H03F 3/2173* (2013.01); *H03F 3/245* (2013.01); *H03F 3/72* (2013.01); *H03F 2200/451* (2013.01)

(58) Field of Classification Search
CPC ........... H03F 1/0288; H03F 1/07; H03F 3/217
USPC ..................... 330/124 R, 295, 251
See application file for complete search history.

(56) References Cited

U.S. PATENT DOCUMENTS

| | | | | |
|---|---|---|---|---|
| 4,460,876 | A  * | 7/1984 | Najman | .................. H03G 3/02 |
| | | | | 330/296 |
| 4,491,802 | A  * | 1/1985 | Uchida | ..................... H03F 1/48 |
| | | | | 330/107 |
| 6,816,012 | B2 | 11/2004 | Aoki et al. | |
| 7,652,539 | B2 * | 1/2010 | Gao | ......................... H03F 1/22 |
| | | | | 330/311 |

(Continued)

OTHER PUBLICATIONS

Aoki, Ichiro et al., "Fully Integrated CMOS Power Amplifier Design Using the Distributed Active-Transformer Architecture", IEEE Journal of Solid-State Circuits, vol. 37, No. 3, Mar. 2002.

(Continued)

*Primary Examiner* — Henry Choe
(74) *Attorney, Agent, or Firm* — Greer, Burns & Crain, Ltd.; Steven P. Fallon

(57) ABSTRACT

A circuit topology including stacked power amplifiers (e.g., class D PA cells) in a ladder arranged in a house-of-cards topology such that the number of stacked-domains follows a decaying triangular series N, N−1, N−2, . . . , N−i from a fixed ladder to an $i^{th}$ ladder to provide a 1:(i+1) voltage conversion ratio, each stacked domain outputs its power via a flying domain power amplifier cell, and each ladder balances stacked domains of a prior ladder and combines power from all prior ladders.

8 Claims, 28 Drawing Sheets

(56) References Cited

U.S. PATENT DOCUMENTS

| | | | | |
|---|---|---|---|---|
| 7,843,269 B2* | 11/2010 | Chen | ...................... | H03F 1/0288 330/124 R |
| 7,876,160 B2* | 1/2011 | Zhang | ................... | H03F 1/0277 330/124 R |
| 8,106,711 B2* | 1/2012 | Adamski | ............... | H03F 1/0216 330/124 R |
| 8,253,495 B2* | 8/2012 | Bouisse | .................. | H03F 1/086 330/124 R |
| 8,447,245 B2* | 5/2013 | Staudinger | ............ | H03F 1/0222 330/124 R |
| 8,610,503 B2* | 12/2013 | Kaczman | ................ | H03F 1/083 330/124 R |
| 8,928,401 B2* | 1/2015 | Verlinden | ............... | H03F 3/005 330/124 R |

OTHER PUBLICATIONS

Arno, Patrik et al., "Envelope Modulator for Multimode Transmitters with AC-Coupled Multilevel Regulators", 2014 IEEE International Solid-State Circuits Conference, ISSCC 2014, Session 17, Analog Techniques, 17.6.

Hassan, Muhammad et al., "A Combined Series-Parallel Hybrid Envelope Amplifier for Envelope Tracking Mobile Terminal RF Power Amplifier Applications", IEEE Journal of Solid-State Circuits, vol. 47, No. 5, May 2012.

Hu, Song et al., "A +27.3dBm Transformer-Based Digital Doherty Polar Power Amplifier Fully Integrated in Bulk CMOSE", IEEE Radio Frequency Integrated Circuits Symposium, 2014.

Madoglio, Paolo et al., "A 20dBm 2.4GHz Digital Outphasing Transmitter for WLAN Application in 32nm CMOS", 2012 IEEE International Solid-State Circuits Conference, ISSCC 2012, Session 9, Wireless Transceiver Techniques, 9.4.

McCune, Jr., Earl W., "pPSK for Bandwidth and Energy Efficiency", Proceedings of the 43rd European Microwave Conference, Nuremberg, Germany, Oct. 7-10, 2013.

McCune, E. "Signal Design and Figure of Merit for Green Communication Links", IEEE, pp. 22-25, 2017.

Reynaert, Patrick and Steyaert, Michiel S.J., "A 1.75-GHz Polar Modulated CMOS RF Power Amplifier for GSM-EDGE", IEEE Journal of Solid-State Circuits, vol. 40, No. 12, Dec. 2005.

Salem, Loai G. et al., "A Flying-Domain DC-DC Converter Powering a Cortex-M0 Processor with 90.8% Efficiency", International Solid-State Circuits Conference 2016.

Salem, Loai G. et al., "A Recursive Switched-Capacitor House-of-Cards Power Amplifier", IEEE Journal of Solid-State Circuits, vol. 52, No. 7, Jul. 2017.

Walling, Jeffrey S. et al., "A Class-G Supply Modulator and Class-E PA in 130 nm CMOS", IEEE Journal of Solid-State Circuits, vol. 44, No. 9, Sep. 2009.

Yoo, Sang-Min et al., "A Switched-Capacitor Power Amplifier for EER/Polar Transmitters", 2011 IEEE International Solid-State Circuits Conference, ISSCC 2011, Session 24, Transmitter Blocks, 24.3.

* cited by examiner

SWITCHED CAPACITOR HOUSE OF CARDS POWER AMPLIFIER

PRIORITY CLAIM AND REFERENCE TO RELATED APPLICATION

The application claims priority under 35 U.S.C. § 119 and all applicable statutes and treaties from prior U.S. provisional application Ser. No. 62/384,912, which was filed Sep. 8, 2016.

STATEMENT OF GOVERNMENT INTEREST

This invention was made with government support under Grant No. D15AP00091 awarded by Defense Advanced Research Projects Agency (DARPA). The government has certain rights in the invention.

FIELD

A field of the invention is power conversion, including power efficient DC power into an AC, as well as DC-DC, AC-DC-AC, and AC-DC conversion. Another field of the invention is transceiver devices. Example applications of circuits and methods of the invention include RF power amplifiers (PA), 20 kHz audio amplifiers, and 50-60 Hz power inverters. The invention can be applied advantageously in portable electronics. Power amplifiers of the invention can provide longer battery operational-time and smaller form-factor as well as reduced assembly costs.

BACKGROUND

DC-AC conversion is an essential function that exists in every electronic device. More importantly, DC-RF power conversion is a primary function in every transceiver. Modern portable devices, cell phones, tablets, laptops, etc, include many transceivers. Typical transceivers utilize lossy transformers, which tax battery life. The typical transceivers also occupy significant real estate, because a power amplifier is built in a separate chip using expensive non-CMOS (complementary metal-oxide-semiconductor) technology (e.g., heterojunction bipolar transistors (HBT)) and then assembled into the system via difficult and expensive heterogeneous integration techniques.

As CMOS continues to scale, faster devices with better conductance and lower capacitance metrics are realized, and better switching performance is achieved. Scaling produces thinner oxide devices, which saves chip real estate but reduces the voltage blocking breakdown capability of the devices. The capability of such devices to produce high voltage and to pump power into the widely used 50Ω antenna weakens because of the lower voltage blocking capability. This creates difficulties for the monolithic integration of the PA power stage into a digital CMOS chip, and negatively impacts the cost and size reductions. The ability to leverage the huge processing capabilities of CMOS DSPs (digital signal processors) is also compromised.

Conventional circuits and methods make it difficult to efficiently generate high levels of RF power in scaled CMOS largely due to the inherently low voltage ratings of core thin-oxide transistors. To realize high output power with low voltage (~1V or less) transistors, power combining techniques have been proposed whereby the output of several low-voltage power amplifier (PA) cells are combined via inductive transformers.

This bulky magnetic (non-CMOS compatible) power combining approach that is widely used in the modern RF market was inspired in 2003 by I. Aoki, S. Kee, D. Rutledge, and Ali Hajimiri, [Aoki et al., "Fully Integrated CMOS Power Amplifier Design Using the Distributed Active-Transformer Architecture," IEEE JSSC, March 2002; Aoki U.S. Pat. No. 6,816,012], which provided a solution for the decreasing CMOS breakdown voltages. The power combining approach introduced by Aoki et al., relies on ultra-thick metal that still carries large ohmic and substrate losses. These AC-AC losses, combined with the DC-AC losses of the power amplifiers (PAs) themselves, and the DC-DC losses of the battery-connected power converters, result in limited total transmitter efficiencies. Even modern digital PA techniques such as RF-DACs, digital Doherty, and digital out-phasing, which have been proposed to leverage the excellent switch performance of scaled transistors and offer reconfigurable operation, still require battery-connected DC-DC converters and RF transformers/power combiners, both of which result in cascaded losses. See, e.g. S.-M. Yoo et al., "A switched-capacitor power amplifier for EER/polar transmitters," in ISSCC, February 2011, pp. 428-430; S. Hu and et al., "A +27.3 dBm transformer-based digital Doherty polar power amplifier fully integrated in bulk CMOS," in RFIC, June 2014, pp. 235-238; P. Madoglio et al., "A 20 dBm 2.4 GHz digital outphasing transmitter for WLAN application in 32 nm CMOS," in IS SCC, February 2012, pp. 168-170.

Modern communication techniques for mobile devices require high-efficiency across a wide dynamic power range. Such techniques include non-constant envelope modulation schemes [e.g., quadrature amplitude modulation (QAM) and Orthogonal frequency division multiplexing (OFDM)], which are important to better utilize allocated bandwidth.

A constellation-points rearrangement has been described to help reduce the peak-to-average power ratio such modulation schemes. See, E. W. McCune, "pPSK for bandwidth and energy efficiency," in Proc. Eur. Microw. Conf., October 2013, pp. 569-572; E. McCune, "Signal design and figure of merit for green communication links," in Proc. IEEE Radio Wireless Symp. (RWS), January 2017, pp. 22-25. Such high peak-to-average power ratio (PAPR) signals still require a PA with high efficiency across a wide dynamic power range.

Class-G supply modulation has been demonstrated to achieve high efficiency at back-off by operating a nonlinear PA from multiple supply voltage levels, typically Vin and Vin2, as determined by the input envelope signal in an EER scheme. See, J. S. Walling, S. S. Taylor, and D. J. Allstot, "A class-G supply modulator and class-E PA in 130 nm CMOS," IEEE J. Solid-State Circuits, vol. 44, no. 9, pp. 2339-2347, September 2009. A second peak at 6-dB back-off in the overall PA efficiency is typically realized by operating the PA from a second supply, $V_{in}/2$, when the input signal amplitude (AM) drops below a predetermined threshold. Such a supply modulator can be implemented using a linear voltage regulator. See, e.g., P. Reynaert and M. S. J. Steyaert, "A 1.75-GHz polar modulated CMOS RF power amplifier for GSM-EDGE," IEEE J. Solid-State Circuits, vol. 40, no. 12, pp. 2598-2608, December 2005. Another know alternative is a hybrid design that includes a linear regulator in parallel to a switching supply modulator. See, e.g., "M. Hassan, L. E. Larson, V. W. Leung, and P. M. Asbeck, "A combined series-parallel hybrid envelope amplifier for envelope tracking mobile terminal RF power amplifier applications," IEEE J. Solid-State Circuits, vol. 47, no. 5, pp. 1185-1198, May 2012. Unfortunately, such approaches require either off-chip or large on-chip inductors for high efficiency. An example dc-dc converter requires two external inductors (4.7 µH and 22 nH) and two external capacitors (0.47 µF and 6.8 nF), and occupies 2.52×2.52 mm² on chip area to realize an 86.2% dc-dc conversion efficiency at 26.3-dBm output power. See, P. Arno, M. Thomas, V. Molata, and T. Jerabek, "17.6 Envelope modulator for multimode transmitters with AC-coupled multilevel regulators," in IEEE Int. Solid-State Circuits Conf. (ISSCC) Dig. Tech. Papers, February 2014, pp. 296-297.

SUMMARY OF THE INVENTION

A preferred embodiment provides a switched-capacitor house of cards power amplifier circuit topology. The circuit topology includes stacked power amplifiers (e.g., class D PA cells) in a ladder arranged in a house-of-cards topology such that the number of stacked-domains follows a decaying triangular series N, N−1, N−2, . . . , N−i from a fixed ladder to an $i^{th}$ ladder to provide a 1:(i+1) voltage conversion ratio, each stacked domain outputs its power via a flying domain power amplifier cell, and each ladder balances stacked domains of a prior ladder and combines power from all prior ladders.

DETAILED DESCRIPTION OF THE PREFERRED EMBODIMENTS

Figure 1A:
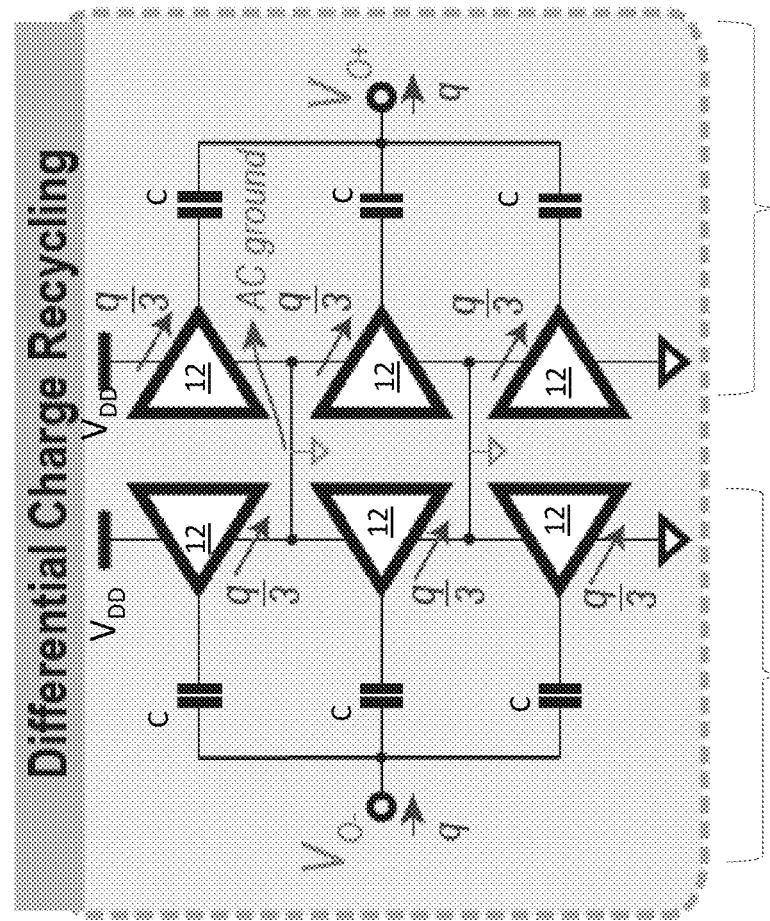
FIG. 1A is a diagram of a preferred embodiment differential ladder converter that performs implicit DC-DC conversion.

Preferred embodiments of the invention provide high-voltage RF power generation via a DC-RF power amplifier inverter topology that achieves implicit DC-DC conversion, solid-state impedance transformation, and high-efficiency at back-off, all in a single circuit. Preferred topologies can use, but don't require, thin oxide transistors. However, preferred topologies are independent of the type and size of transistors utilized.

In preferred circuits, high efficiency across a wide output range is primarily achieved by 3 techniques: 1) a ~100% efficiency implicit DC-DC conversion approach that vertically stacks PA cells (i.e., by connecting the positive supply terminal of the bottom PA cell to the negative supply terminal of the stacked PA cell) in a ladder topology; 2) flying the individual PA cells, in relation to the battery rails, in a 2-phase recursive house-of-cards (RHoC) switched-capacitor network (i.e., where a stack of N PA cells connect to a stack of N−1 PA cells in a decaying triangular series) that conforms well to KVL equations (Kirchoff Voltage Law equations), to provide PA cell voltage addition (i.e., solid-state impedance transformation) without exceeding the voltage ratings of the employed thin-oxide devices; and 3) capacitive combining of PA slices (set to different gains) via a voltage-domain digital Doherty architecture that does not require any λ/4 element, thereby achieving high efficiency at back-off in minimal silicon area.

Preferred embodiments can overcome inherent challenges to the use of thin-oxide transistors having low (~1V) breakdown voltages. Preferred embodiments provide a step-down from voltages typical of modern battery powered systems (typical ~4-5V) without the need for a step-down conversion followed by a step-up that is needed, for example, for RF waveform amplification. Delivering >20 dBm of output power to a 50-Ω antenna requires >5 V peak-to-peak swing. In typical prior circuits, the large battery voltage is stepped down to drive thin-oxide CMOS transistors that perform RF waveform amplification, after which the low-voltage RF waveform is transformed back up to a higher voltage via an impedance transformation network to drive 50-Ω with sufficient power. Preferred embodiments provide a digital PA with stacked and flying PA unit cells (e.g. class D PA cells). The cells are arranged in a switch capacitor house of cards topology, and enable efficient high output power generation directly from a typical 4.8-V supply, while using thin-oxide low breakdown voltage (~1V) CMOS transistors. Preferred embodiment circuits are modular and recursively reconfigurable to accommodate a plurality of battery-to-RF voltage ratios. Experimental circuits have demonstrated high battery-to-RF efficiency is achieved both at peak and 6-dB back-off power via a voltage-mode Doherty-like capacitive power combining technique.

An advantage provided by preferred embodiments of the invention include CMOS compatibility and a topology that consists of switches and capacitors (no inductors/lossy transformers are used). Preferred embodiments therefore provide high efficiency because lossy DC-DC step-down converters and lossy impedance transformers are not used, which provides longer battery life. Small form factor and cost are also advantages, because there is no need to build the PA in a separate chip using non-CMOS expensive technology (e.g., HBTs (heterojunction bipolar transistors) and then assemble a system-in package circuit using expensive heterogeneous integration. No bulky transformers are used in preferred embodiments.

Preferred embodiments include fully-integrated switched-domain (flying-PAs) impedance matching and power-combining methods and circuits, which unlike prior combining techniques, inverts the infamous trend of lower efficiencies and degraded PA performance with the decreasing breakdown voltages of Moore's CMOS scaling. Preferred embodiment CMOS-friendly power combining topologies actually gain higher efficiencies/performance with thinner gate oxide short-channel MOS transistors.

Preferred circuits include a topological arrangement of individual low-voltage PA cells in a switched-network that satisfies KVL equations across all phases, without any added components that provide power combining Unlike conventional transformer based power combining, the present topological combining can provide linear reconfigurable impedance matching for high back-off efficiency.

A preferred embodiment provides a new topology for DC-AC conversion. It is a CMOS friendly PA topology, that can provide better efficiencies and linearity as CMOS scales, while being able to deliver power levels higher than 30 dBm (1 Watt). A preferred embodiment consists of low-voltage transistor switches and capacitors to produce high output AC power in a very efficient manner. No lossy and bulky transformers on chip are required.

A power combiner and impedance transformer that is completely capacitive (with zero magnetics) is provided by preferred embodiments, which combines powers from multiple standard-cell PA cells to produce high output power in an RF antenna. Magnetics are lossy on CMOS and hard to integrate on chip. In addition, the preferred power combiner eliminates the need for an input voltage regulator, and can be connected directly to an input battery, without extra circuitry. It can also could achieve "flat" efficiency across the output range. In an example handset application, this means, with all other properties, the handset power consumption (where a power amplifier is the dominant power consumer in all transceiver circuits and in a whole SoC as well as its dc-dc converter), could be reduced by up to 3 times, as compared to conventional approaches.

There are other interesting aspects of the invention. One of them is spurious noise. In other types of power amplifiers, there has to be a DC-DC converter of some sort for voltage regulation. Such DC-DC converter operates at low switching frequency ~10-50 MHz, which causes spurious and inter-modulation distortion in the transmitter. Preferred embodiments include no DC-DC converter and in fact everything switches at the carrier frequency, thereby, there are no such spurious tones at all, which enables a reliable design of the transmitter without overhead (power and area) circuitry that tries to subside such spurious tones.

An example prototype was constructed in 65 nm bulk CMOS process. We were able to measure 23 dBm at 40.3% efficiency directly from the battery which remains flat as output power is reduced down by −6 dB from the 23 dBm. Such flat efficiency across wide output power range is important in present modulation techniques, since all spectrally efficient modulation schemes produce wide output power range. In most prior published results, such efficiency is limited to 20%, and decays by up to 10% at −6 dB back-off. On the other hand, according to post layout simulations, the example prototype was able to achieve ~30 dBm at 60% efficiency, directly from the battery. While the example embodiment power amplifiers were implemented in CMOS, the present amplifier is not limited to a particular class of transistor, and can be implemented in other transistor technologies such as BJTs, HEMTs, GaN, and etc Preferred embodiments provide a DC-RF power inverter that efficiently synthesizes high-voltage RF waveforms directly from a battery voltage using thin-oxide (e.g., ~2 nm) CMOS switches. As CMOS continues to scale and new processes are developed, the present House of Cards voltage amplifier topology can be implemented. The present topology is not dependent upon a specific CMOS or other transistor technology, but is particularly advantageous with thin-oxide CMOS. Instead of stacking transistors or employing large inductive transformation ratios, high output power is generated by switching individual class-D power amplifier (PA) cells in a 2-phase house-of-cards (HoC) topology to provide voltage addition of the cells outputs without exceeding device voltage ratings, effectively resulting in a solid-state RF impedance transformer. High-efficiency at back-off is then achieved by capacitively combining the output of two HoC networks nominally set to generate different amplitudes, enabling voltage-mode Doherty-like back-off without a bulky transmission line. An example prototype PA implemented in 65 nm bulk LP CMOS, operates from 4.8V, and provides a battery-to-RF efficiency above 40% at both 23 dBm and 6 dB back-off at 720 MHz Other embodiments include applying the basic building unit PA cell of the example embodiments to other class amplifiers. The invention is not limited to class-D PA. It can be any of the available PA classes. For example, it can be any of the PA classes from A, B, C, . . . , or O.

The example embodiment illustrated with class-D PA cell, where the present topology produces square output signal that is band-pass filtered. In other embodiments, a multi-level DC-RF power inverter synthesizes high-voltage RF waveforms of arbitrary bandwidth and shape complexity directly from the system battery with no required filters or matching networks, all at high (>30 dBm) power using low-voltage CMOS switches. This is accomplished with m cascaded ladders, each of stacked PA cells, that are switched (fired) at switching angles, $\alpha k$, of the RF period to eliminate the odd harmonics and attain a fundamental amplitude. The proper firing angle is:

$$h_n = \left| \frac{4}{n\pi} \sum_{k=1}^{m} [V_k \cos(n\alpha_k)] \right|$$

Where $h_n$, is the $n^{th}$ harmonic amplitude, so by selecting the proper $\alpha k$ the desired fundamental amplitude can be achieved while eliminating $m^{-1}$ odd harmonics, in a differential architecture. This can eliminate the need for any output filtering, and hence enables wide-band operation. In addition, by eliminating filtering, inductors are not required which reduces losses significantly as well as the consumed area on the die.

In other embodiments, other PA classes can be used to implement the unit-cell. Thereby, in some cases, the operation of the proposed PA approaches a multi-level out-phasing PA, where the various cascaded. Ladders are switched at an angle to modulate the amplitude of the fundamental component while eliminating (minimizing) the other harmonics.

Preferred embodiments are amenable for automatic synthesis using an algorithm on a computer. A set of standard cells are utilized to synthesize any required DC-AC inverter in minimum time. Therefore, as in a microprocessor design which is synthesized through primitive pre-designed standard gates (AND, OR, XOR, etc.), a DC-RF or DC-AC converter can be automatically synthesized from pre-designed standard PA cells of the invention. Preferred embodiment standard PA cells are amenable to fit in a row-based standard CMOS layout, where $V_{DD}$/GND wires are routed within each row.

Preferred embodiments of the invention will now be discussed with respect to the drawings and with regard to experiments that were conducted. The drawings may include schematic representations, which will be understood by artisans in view of the general knowledge in the art and the description that follows. Features may be exaggerated in the drawings for emphasis, and features may not be to scale. The experimental examples will also illustrate broader features of the invention to those having skill in the art.

FIG. 1A illustrates a preferred embodiment differential ladder converter 10 that performs implicit DC-DC conversion by dividing $V_{BAT}$ in three across each of the PA cells 12 in a single stack. The converter 10 is a differential converter, with a negative output ladder 10a and a positive output ladder 10b. The overall power amplifier operates directly at the battery (or on-chip process) voltage $V_{BAT}$, which refers to the input voltage to the power amplifier. Multiple power amplifiers 12 are stacked and each operates at the input voltage divided by 3 (i.e., $V_{BAT}/3$). The stack is set to reduce the input voltage to the level of the maximum voltage available across each transistor used in the amplifiers 12. The unit of charge flowing through each unit amplifier 12 is q/3, while the charge flowing through the ladder 10 is q. The amplifiers 12 in the preferred embodiment are N (N=3 in the example for each differential stage) class D amplifier cells, and the output power from each of the amplifier cells 12 is capacitively coupled and combined to the load via capacitors C, half of which are connected together and to the negative load output $V_{o-}$, and the other half are connected together and to the positive load output $V_{o+}$. The capacitors C and the amplifiers 12 are arranged as the switched-capacitor DC-DC ladder converter 10 that provides active regulation to inter-domain nodes. To eliminate mismatch current loading, the inter-domain nodes of the first DC ladder in opposite-phase PAs, i.e. in a differential PA, are tied together, The topology creates virtual AC grounds at all inter-stacked PA nodes of ladders, where the AC current imbalance between stacked domains is eliminated, realizing nearly 100%-efficiency DC-DC conversion.

Figure 1B:
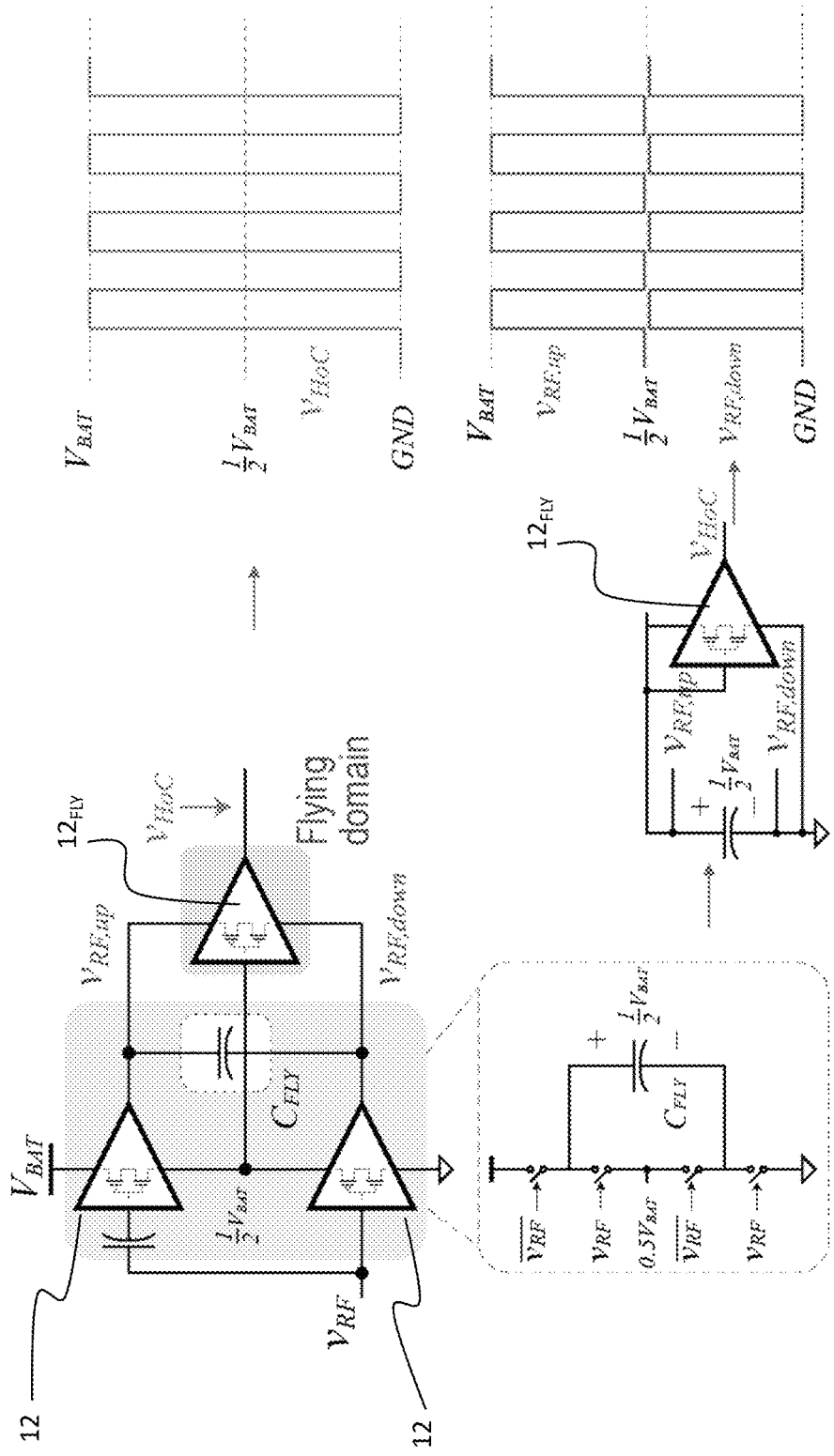
FIG. 1B is a diagram of a preferred embodiment of the switched-capacitor House of Cards topology, along with a half-cycle operation and waveforms.

FIG. 1B illustrates a preferred embodiment of the switched-capacitor House of Cards topology, along with a half-cycle operation and waveforms. Here, a ladder of stack N=2 connects the outputs of the two PA cells 12 via a flying capacitor, $C_{FLY}$, along with an additional PA cell $12_{FLY}$, termed the Flying domain. When the input RF signal is near its minimum value within a single RF cycle, the flying capacitor and flying domain exist in the down state (state 1); since the input of the flying-domain PA cell in this state is connected to $V_{BAT}/2$, the constituent NMOS transistor is turned on, and the overall PA output voltage, $v_{HoC}$, is connected to ground. When the input RF signal is near its highest value within a single RF cycle, the flying capacitor and flying domain are connected in the up-state (state 2 (mirror image of state 1, not shown); since the input of the flying-domain PA cell in this state is connected to $V_{BAT}/2$, the PMOS transistor is on, and the overall PA output voltage, $v_{HoC}$, is connected to $V_{BAT}$. By switching between these two phases at the RF frequency, an RF waveform of peak-to-peak amplitude $v_{BAT}$ is generated, yet the maximum voltage seen across any transistor is only $v_{BAT}/2$.

Figure 1C:
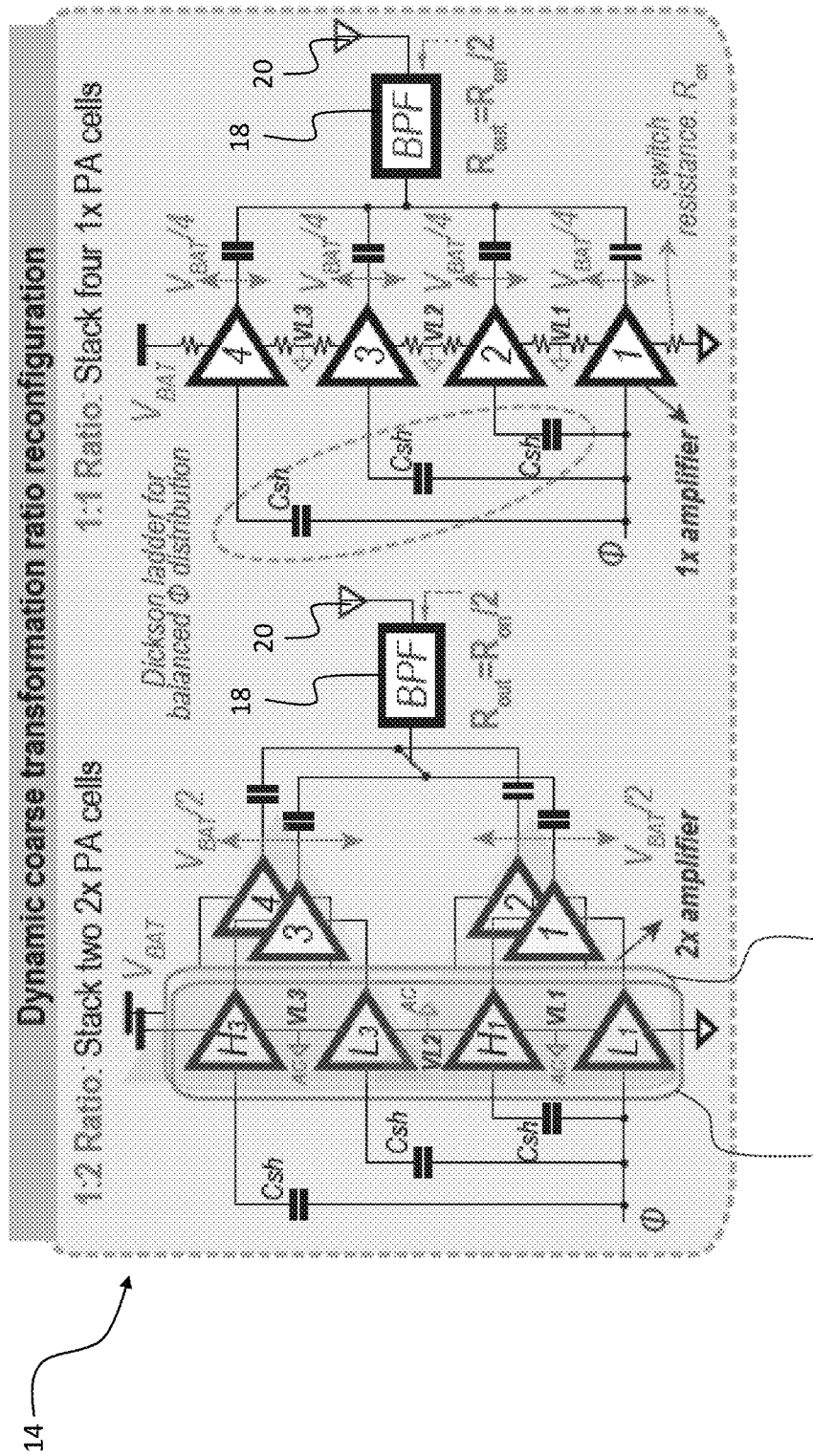
FIG. 1C illustrates a preferred embodiment transformer with two different ratios that stacks the converter stages in a recursive house-of-cards topology.

FIG. 1C illustrates a preferred embodiment transformer 14 (left shows the 1:2 ratio and the right shows the 1:1 ratio) that stacks the converter stages 10 in a recursive house-of-cards topology such that the number of cascaded stacked-domains follows a decaying triangular series N, N−1, N−2, . . . , N−i from a fixed ladder (the first ladder) to the $i^{th}$ ladder to provide a 1:(i+1) voltage transformation ratio through voltage addition and each flying ladder provides balancing of stacked domains of a prior ladder and combines power from all prior ladders. In FIG. 1C, the separate PA cells labelled as 12 in FIGS. 1A and 1B are given separate labels, e.g., high and low $H_N$ and $L_N$ or a numerical designation N, and the labels are used to indicate the cell placement upon a recursive rearrangement of the structure. A commutation of switches permits addition of PA voltages (voltage-domain combining) to create the solid-state impedance transformer 14, and a bandpass filter 18 drives an antenna 20 with the signal from the amplifier 14. In FIG. 1C, each stacked power ladder amplifier (22, 24 and 28) includes at least two power amplifier cells, at least one flying capacitor, and at least one flying power amplifier cell whose input is connected to a mid-rail DC voltage from the previous stage's ladder. The transformer 14 of FIG. 1C is a 12-cell block illustrating how the HoC topology can be reconfigured to implement a solid-state RF impedance transformer that can achieve two voltage transformation ratios: 1:2 (left) and 1:1 (right), and a 1:4 ratio is illustrated later in FIGS. 8A and 8B. Additional voltage transformation ratios are generated by capacitively-combining the output of one or more house-of-card stages with either a different DC potential, or with another house-of-card stage set to a different voltage conversion ratio. Each of a plurality of ladders is capacitively switched such that each can be reconfigured between multiple voltage transformation ratios such that each ladder can be swapped to act as a peaking amplifier without wasting any silicon area. One could achieve lower ratios simply by turning off the last PA cells in the triangular series. However, this wastes on-chip resources (e.g., less capacitance is switching in such cases), and further causes different effective output resistances for each ratio, which can degrade achievable linearity. In the preferred recursive House of Cards arrangement, the last PA cells in the decaying triangular series which are no longer required are preferably folded back, via a recursive algorithm, to increase the effective amount of flying capacitance per prior-stage ladder to improve efficiency, while also ensuring the effective output resistance of the circuit remains constant across all ratios for improved linearity.

By following a recursive reconfiguration algorithm, all ratios maintain ~100%-efficiency DC-DC conversion through charge-recycling and use 100% of available on-chip resources. The 1:2 transformation ratio is realized by organizing the 12 PA cells such that 8 of the set establishes 2 parallel initial DC ladders, connected between $V_{BAT}$ and GND, while the remaining 4 PAs, (i.e., cells 1, 2, 3, 4 in FIG. 1C), are connected in cascade as flying islands. An identical differential stage for Vo☐ is implemented and the inter-stack nodes $V_{L1}$, $V_{L2}$, $V_{L3}$ of the initial DC ladder in both $V_{o+}$ and $V_{o+}$ phases are tied together to establish AC grounds within the fixed and cascaded flying PA ladders, thereby eliminating DC balancing losses. In order to realize the 1:1 ratio for higher efficiency at 6 dB backoff, the PMOS switches in the pre-driver PA stages ($H_4;L_4$) and ($H_2;L_2$) are permanently enabled to connect cells 4 and 2 to the up position, while ($H_3;L_3$) and ($H_1;L_1$) NMOS switches are on, connecting cells 3 and 1 to the down position, enabling fixed $R_{out}$ across both transformations ratios.

Figure 2A:
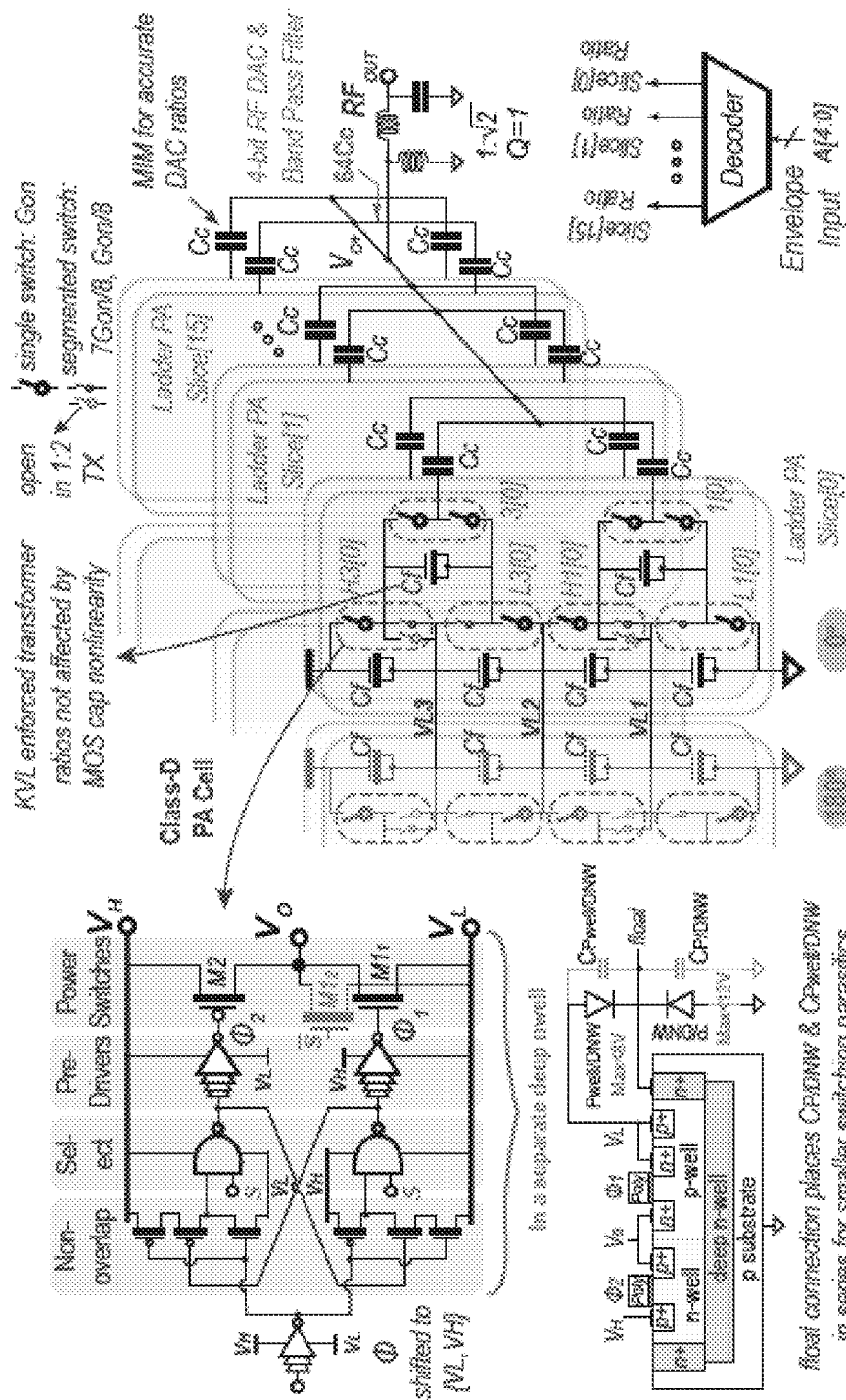
FIG. 2A illustrates a class D PA cell schematic and an implementation of a 5-bit amplifier using the FIG. 1B topology.

FIG. 2A illustrates a class D PA cell schematic and an implementation of a 5-bit amplifier. Each class-D PA cell is switched according to a constant-envelope digital phase signal φ level shifted to the corresponding stacked domain on-chip using a capacitive level shifter [see, e.g., 5 L. G. Salem, J. G. Louie, and P. P. Mercier, "A Flying-Domain DC-DC Converter Powering a Cortex-M0 Processor with 90.8% Efficiency," in ISSCC, February 2016], but using a Dickson ladder (as shown in FIG. 1C). In addition, fixed-to-flying sampled shifters [L. G. Salem, J. G. Louie, and P. P. Mercier, "A Flying-Domain DC-DC Converter Powering a Cortex-M0 Processor with 90.8% Efficiency," in ISSCC, February 2016] that convert fixed-rail logic signals to flying-domain logic levels are employed to distribute φ to cells 1-4. Two non-overlap clock phases φ1, φ2 are generated from through 3-transistor inverters to realize minimum dead-time and eliminate shoot-through currents. Each PA cell is placed inside a separate deep-nwell (FIG. 2A, bottom-left) to maintain constant $V_t$ for fixed conductance and minimum distortion, while also enabling high-voltage amplitude swings without device stacking (where the maximum swing is limited by the <12V breakdown voltage of the DNW/substrate diodes). To reduce the deep-n well parasitics by ~2×, the deep-n well bias is left floating while the inner p well is shorted to its respective flying ground to prevent latch-up. MOS capacitors $C_f$ (0.6 pF) are used for each cell as voltage clamps to enable automatic voltage balancing against non-fully differential signals and to also provide decoupling of the cell gate-drivers.

Figure 2B:
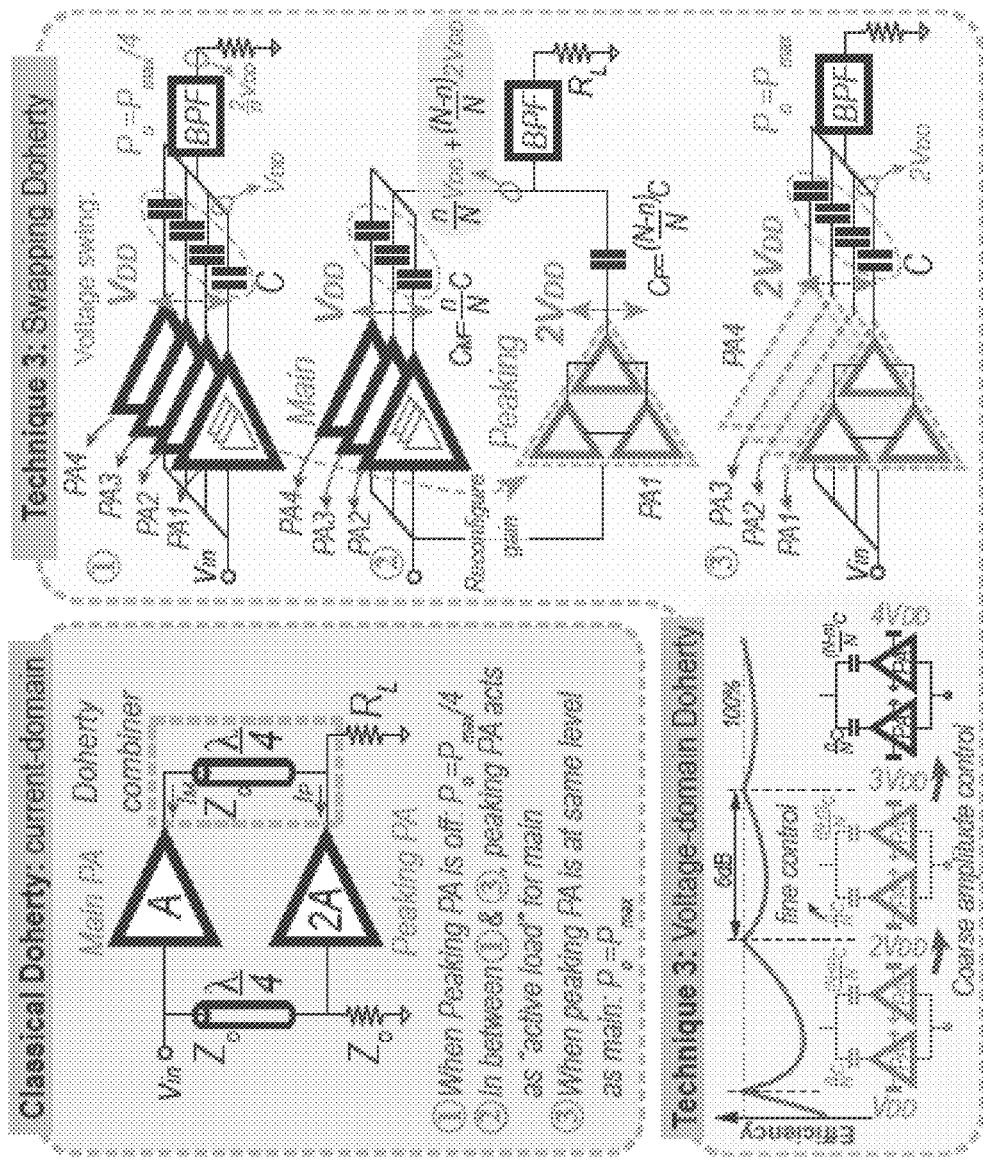
FIG. 2B compares a classical Doherty method to a swapping Doherty method of the invention.

A conventional Doherty method couples two amplifiers through λ/4 combiner to supply a semi-flat efficiency across a 6 dB linear range (FIG. 2B). Unlike the original implementation which treats amplifiers as current sources, a simpler architecture without using any λ/4 element (i.e. lossy magnetics) is provided with a preferred embodiment of the invention, as shown in FIG. 2B. Essentially, the main and peaking amplifiers are employed as voltage sources of different amplitudes, $V_M$ and $V_P$, respectively, that are capacitively coupled to provide fine amplitude control between $V_M$ and $V_P$. Classical Doherty implementations disable the peaking amplifier at backoff, wasting significant silicon area. In the present implementation, 100% resource utilization (i.e., without disabling any PA cells) can be achieved via a swapping-Doherty architecture. Since each amplifier ladder slice can be reconfigured between 2 gain settings (transformation ratios), each slice of the main amplifier can be reconfigured (i.e. swapped) to act as a peaking amplifier without wasting any silicon area. To implement the present modified Doherty, 16 reconfigurable ladder slices (each comprising 12 class-D cells) are capacitively coupled and thus form a 4-bit RF DAC with 25 pF of total MIM coupling capacitance (FIG. 2A). In general, any arbitrary number of slices greater than 2 can be used. 16 slices were implemented in the experimental chip. The 2 principal transformation ratios boosts the achievable resolution to 5 bits, while enabling high back-off efficiency through Doherty operation with Doherty-like losses limited to $C_S(V_M-V)^2 f_o$, where $C_s$ is the series combination of $C_M$ and $C_P$. An inductive output band-pass filter is used to resonate with the coupling capacitance while providing minimal transformation (~1:√2).

Implicit DC-DC Conversion with Stacked-Amplifier Charge-Recycling

The non-constant envelope modulation schemes discussed in the background use circuit that typically require off-chip dc-dc conversion or large on-chip inductors. FIG. 3A (prior art) illustrates an example of such a circuit, which represents a conventional class-G operation that uses an extra dc-dc converter to supply a 6 dB back-off.

Figure 3B:
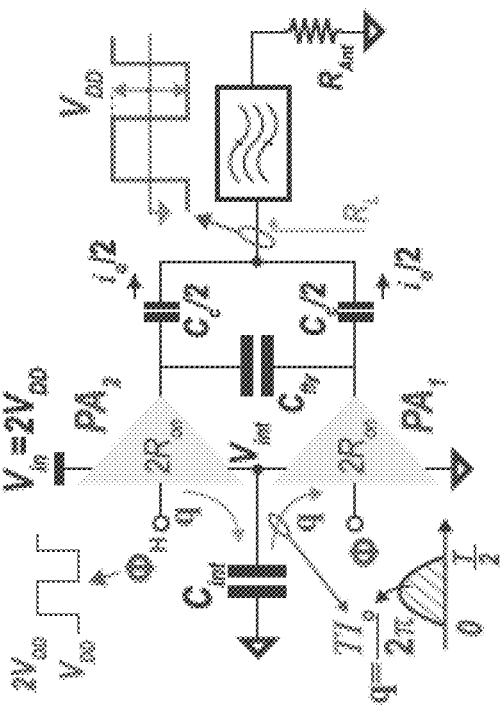
FIGS. 3A (prior art) and 3B compare the prior techniques that require off-chip dc-dc conversion or large on-chip inductors to a preferred embodiment that avoids the need for such off-chip dc-dc conversion or large on-chip inductors.
Figure 3A:
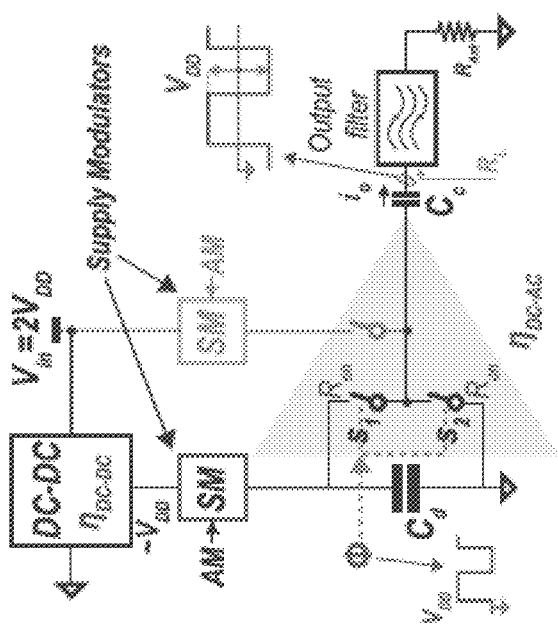

FIG. 3B shows an embodiment of the invention that avoids the need for such off-chip dc-dc conversion or large on-chip inductors. With the FIG. 3B circuit, implicit high-efficiency dc-dc downconversion at 6-dB backoff can be realized without external dc-dc converter by stacking two half-sized class-D PA cells, PA1 and PA2, each half of the PA total conductance, on top of each other while coupling their outputs through a flying capacitor, Cfly, and operating the stack from $V_{in}$=2 $V_{DD}$. Each PA in the stack delivers half the total output power $$P_{out} = \frac{2}{\pi^2} \frac{V_{DD}^2}{R_L}$$

to the load RL. The charge dumped by the top domain, $$q = \int_0^{T/2} \sin\left(\frac{2\pi}{T}t\right)dt = TI_0/2\pi$$

where T is the RF carrier period and 2q is the total output charge delivered during half the period, matches the charge absorbed by the bottom domain, thereby the intermediate node Vint is automatically balanced to $V_{DD}$. In a practical implementation, a small $C_{fly}$ value matches the switching phases for PA1 and PA2 and establishes a 2:1 SC dc-dc converter by reusing PA1 and PA2 switches to provide active regulation to $V_{int}$. Unlike the class-G dc-dc converter of FIG. 3A that has to provide the total PA output power, the established 2:1 SC dc-dc sources or sinks only a small delta current due to minimal charge imbalance between the stacked domains, PA1 and PA2.

Figure 4A:
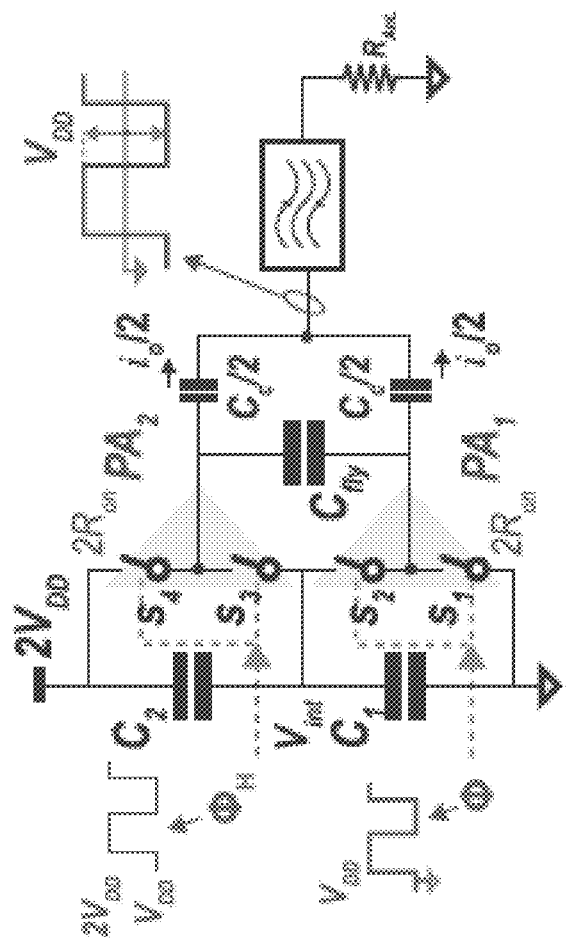
FIGS. 4A-4C show a switch-level block diagram and operation of the example two-stack PA of FIG. 3B.
Figure 4B:
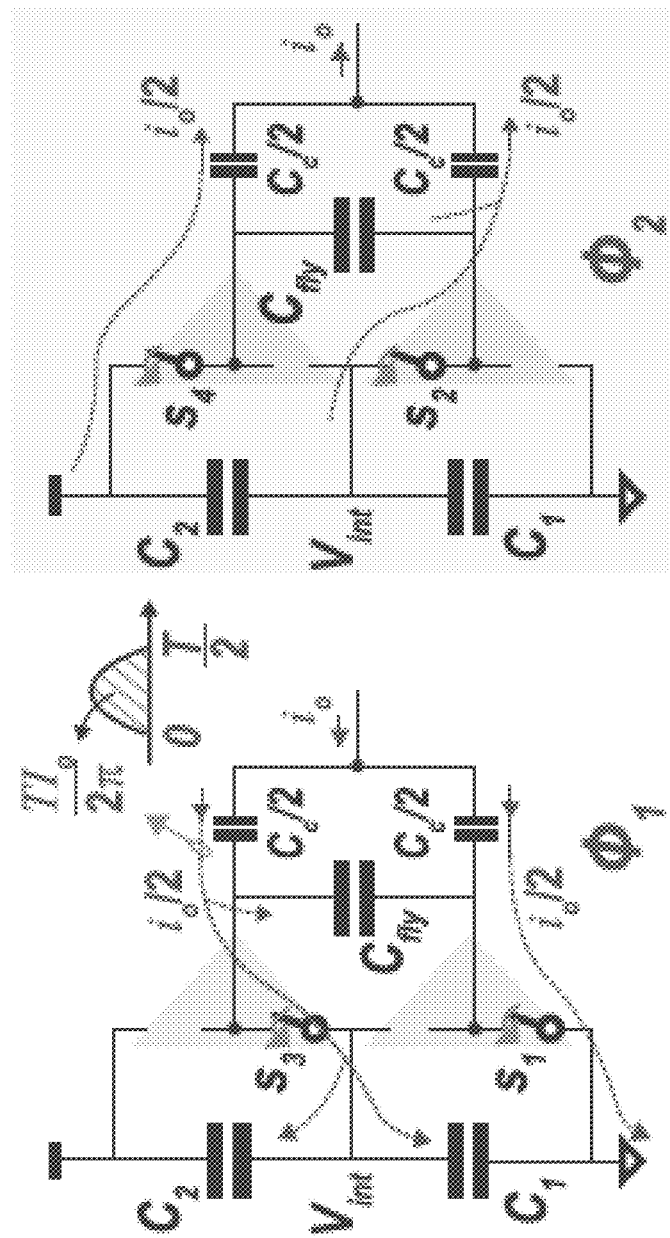
Figure 4C:
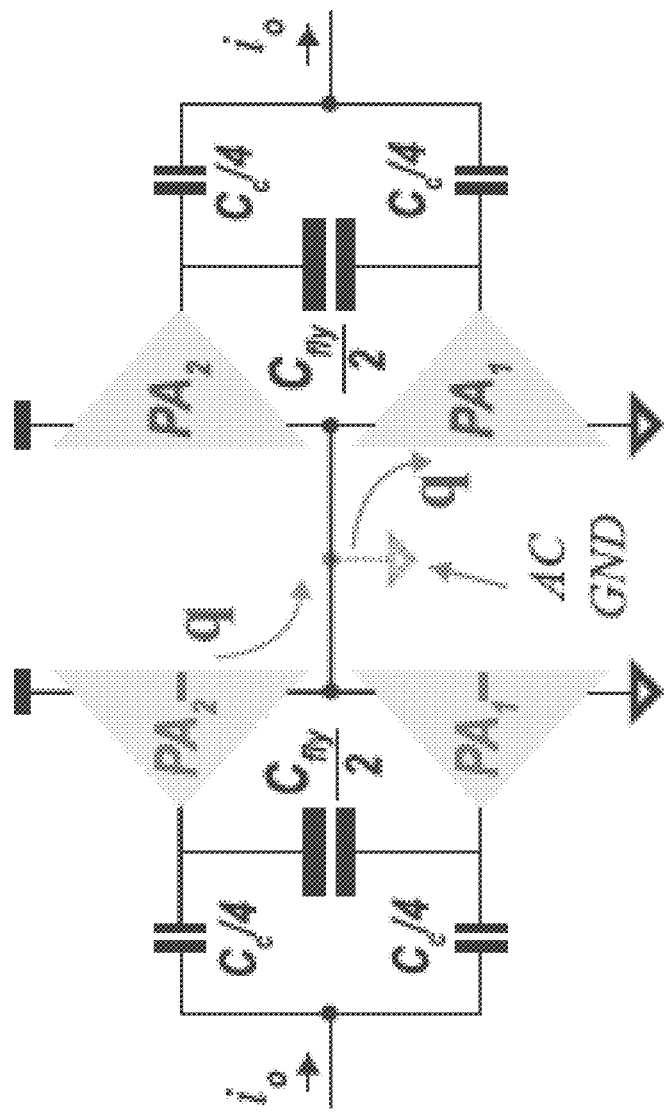

FIGS. 4A-4C show a switch-level block diagram and operation of the example two-stack PA of FIG. 3B. FIG. 4A is the switch level block diagram. FIG. 4B shows the resulting two switched networks when the PM clock is high and low. FIG. 4C illustrations the differential operation that eliminates $V_{int}$ capacitance. The switches are controlled by the PM clock. FIG. 4A shows the resulting networks during the phase when the PM clock is high ($\varphi_1$) and when the clock is low ($\varphi_2$). During $\varphi_1$, the odd-numbered switches are turned on, connecting the flying capacitor, $C_{fly}$, between the midlevel voltage, $V_{int}$, and ground. Consequently, capacitors $C_{fly}$ and $C_1$ are connected in parallel and charge sharing occurs to balance the voltage across $C_1$ to $V_{in}/2$ at steady state. During $\varphi_1$, RL is ac-coupled to $V_{int}$ and GND through switches $s_3$ and $s_1$ in parallel, while $Cf_{ly}$ holds a dc voltage of approximately $V_{DD}$. From FIG. 4B, during $\varphi_1$, the top PA2 charges the intermediate node $V_{int}$ by a half sinusoid with amplitude $I_o/2$. Therefore, $V_{int}$ jumps by $\Delta V \approx (TI_o/((2\pi)(C_1+C_2+Cf_{ly})))$. In $\varphi_2$, the even-numbered switches are ON, connecting $C_{fly}$ in parallel to $C_2$ to balance the voltage across $C_2$ to $V_{in}/2$. At the same time, ac-coupled RL is brought up to $V_{in}$ and $V_{int}$ through switches $s_4$ and $s_2$. On $\varphi_2$, the charge $q=TI_o/(2\pi)$ stored on the capacitors $C_1$, $C_2$, and $C_{fly}$ during the prior phase is released back to supply PA1 . As a result, $V_{int}$ droops by $\Delta V$.

Alternating between the two phases $\varphi_1$ and $\varphi_2$ along with the boundary condition of continuous voltage across the capacitor $C_1$, $C_2$, and $C_{fly}$ during phase switching enforces all capacitors voltages and $V_{int}$ to reach $V_{in}/2$ at steady state through the imposed Kirchhoff's voltage law (KVL) equations, irrespective of the initial voltage level [the method for calculating the KVL equations is provided in L. G. Salem and P. P. Mercier, "A recursive switched-capacitor DC-DC converter achieving 2N−1 ratios with high efficiency over a wide output voltage range," IEEE J. Solid-State Circuits, vol. 49, no. 12 pp. 2773-2787, December 2014.]. The topology of FIGS. 4A-4C thereby utilizes the switches to perform simultaneous power delivery at both the dc and the RF $f_o$ components.

The size of the capacitors $C_1$, $C_2$, and $C_{fly}$ determines the amount of voltage ripple, $\Delta V$, on $V_{int}$. For 10% ripple, $C_1$, $C_2$, and $C_{fly}$ should be assigned equal sizes, i.e., one third of the total on-chip capacitance of $10 \times TI_o/(2\pi V_{DD})$. For reducing the amount of required capacitance, an ac virtual ground is created at $V_{int}$ in FIG. 4C by tying together the $V_{int}$ nodes of two 2-stack PAs and driving them in opposite phases. Through the established differential operation, the current dumped by PA2—into $V_{int}$ cancels the current drawn by PA1 during $\varphi_1$, and vice versa in $\varphi_2$, and hence, the required total capacitance for dc balancing is nearly zero. Practically, $C_1$ and $C_2$ should still be large enough to decouple the required gate-drive charge only during the brief nonoverlap time between $\varphi_1$ and $\varphi_2$, e.g., $C_1=C_2 \approx CG$, where CG is the total gate capacitance of PA1 or PA2. This decoupling capacitance is typically implemented using thin-oxide gate capacitance. Unlike the power switch that is typically implemented using multiple parallel fingers with large area overhead for drain and source regions, the MOS capacitor can be implemented using a single transistor finger of almost equal width and length and, therefore, in a denser manner. The parasitic top/bottom capacitors of the required decoupling capacitance are at a fixed voltage level relative to the ground and, therefore, do not result in parasitic switching losses. On the other hand, $C_{fly}$ should be set, such that $1/(\overline{\omega}_0 C_{fly}) < 2R_{on}$ where $R_{on}$ is the total equivalent output resistance $R_{out}$ of the PA, for phase-aligned ac operation. It is important to note that the KVL equations are underconstrained when stacking the two PAs without $C_{fly}$. In other words, there are too few links in the directed graph of the switched network in FIGS. 4A-4C to provide a single unique solution for $V_{int}$. To establish a properly posed switched topology, $C_{fly}$ is employed (as discussed with respect to FIG. 1B) to enforce a unique solution for $V_{int}$.

The two-stack differential PA topology provides multiple advantages for scaled CMOS technologies as compared with the representative class-G system when operating at 6-dB back-off First, the preferred differential topology provides the required supply, $V_{int}=V_{DD}$, for 6-dB backoff without any extra dc-dc converter. The stacked topology also enables powering the PA cells from a 2-$V_{DD}$ input without violating the employed thin-oxide switches breakdown voltage.1 In addition, the stacked PA does not suffer from cascaded losses at 6-dB backoff due to a dc-dc converter in series with a PA as in conventional class-G PA approaches. Instead, the efficiency of the two-stack PA becomes $\eta_{dc-ac}=(1+R_o n/R_L)^{-1}$, which approaches 100%. Second, the implicit high-efficiency switching dc-dc conversion implemented through stacking the two PA slices does not produce spurious output noise, even with the inherent 2:1 SC, where it operates at the carrier frequency $f_o$. On the other hand, most PAs operated from explicit dc-dc converters produce spurs at the fundamental reduces the off-chip supply decoupling tree size by two times. More importantly, the lower input current $I_{in}$ drawn by the stacked PA, in FIG. 3B, results in four times lower $I_{in}^2 R$ loss in the PA $V_{in}$ power supply, where R is attributable to the power transistors, filter elements, and interconnections in the $V_{in}$ dc-dc regulator.

Figure 5:
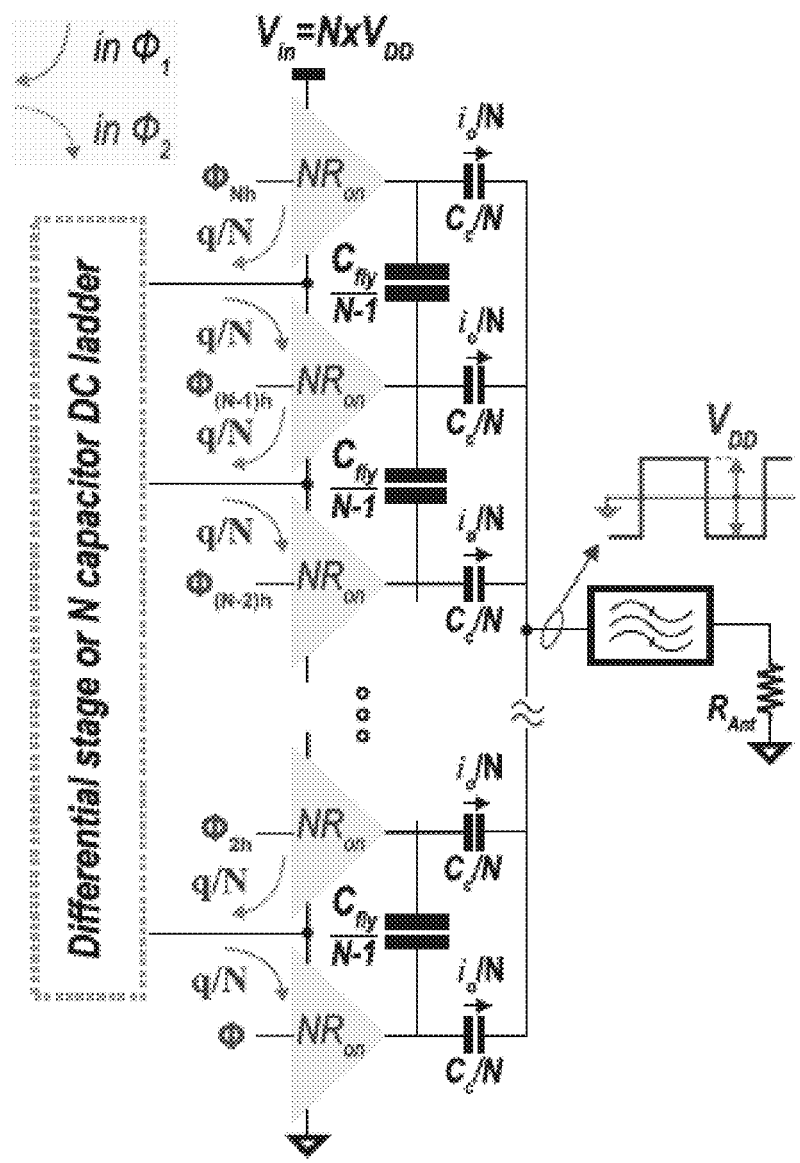
FIG. 5 illustrates the general implicit dc-dc conversion of the invention for a single fixed ladder via charge recycling

FIG. 5 illustrates the general implicit dc-dc conversion of the invention for a single fixed ladder via charge recycling. The same total dc capacitance, i.e., $C_1+C_2$ in FIGS. 4A-4C, can be equally divided between the N−1 intermediate nodes for the same ripple amplitude as the two-stack PA. in the case of a non-differential operation, a similar explanation is applicable for $C_{fly}$. The preferred embodiment implicit charge-recycling dc-dc conversion can be generalized to realize $(2/\pi) V_{DD}$ output voltage amplitude from $V_{in}=NV_{DD}$ using $V_{DD}$-rated thin-oxide devices. Instead of stepping the input battery voltage $V_{in}$ down by N:1 through a lossy and bulky dc-dc converter, the general approach of the invention, as shown in FIG. 5, slices a nominal PA, with conductance $G_{on}$ (conductance for a single switch) for a given output current driving capability $i_o$, into N PA cells (corresponding to item 12 in FIGS. 1A and 1B), each with conductance $G_{on}/N$. Then, the approach stacks the N PA cells, each operating at the nominal process voltage $V_{DD}$, while the entire stack is powered from $NV_{DD}$, such that the charge discarded by the topmost PA cell trickles down through the N-PA stack to be recycled at each level, achieving ~100% dc-dc efficiency. The N−1 flying-capacitor ladder (all NR plus capacitors) is employed to enforce phase alignment among the stacked N PA cells and establish a properly posed topology. In fact, such a ladder with the switches of the PA cells forms an N:1 SC ladder dc-dc converter, which provides active regulation to the interdomain nodes (i.e., the nodes connected to the differential stage block in FIG. 5). Interestingly, the same total dc capacitance, i.e., $C_1+C_2$ in FIGS. 4A-4C, can be equally divided between the N−1 intermediate nodes in FIG. 5 for the same voltage ripple amplitude as the two-stack PA, in the case of a non-differential operation. FIG. 5 illustrates an N stack, while FIGS. 4A-4C illustrate the case where N=2. In addition, $C_{fly}$ in FIGS. 4A-4C is equally divided among the employed N−1 capacitors in FIG. 5, to realize the same relative alignment, given that the conductance of each PA cell is reduced by a factor of N.

The number of stacked amplifiers N can be reduced to maintain the target $P_{out}$ level as the battery voltage drops over time. On the other hand, if an external voltage regulator is employed to provide a fixed PA Vin, the proposed N stacked-PA approach enables a significant boost in the regulator dc-dc efficiency. It is important to note that the higher the dc-dc conversion ratio from the input battery voltage, the larger the dc-dc inherent losses. Furthermore, it is preferred to deliver the required PA input dc power at higher voltage levels Vin=N×$V_{DD}$, since the resulting N times lower current densities enable smaller loss and higher dc-dc regulator efficiency. For example, if we have a stack of 4 PA cells and initially the battery voltage is connected across the 4 stacked PA cells. When the battery voltage decays from 4V to 3V, the battery terminal can be connected across a 3 stacked PA cells (starting from the ground) instead of being connected across the 4 stacked PA cells using a plurality of switches while the fourth cell is connected on top of the three cells (i.e. on top of the battery). This way the fourth cell acts as a voltage boost converter that generates ~4V across the entire stack of 4 PA cells. The result of this operation, essentially, is that when the battery voltage decays, the intrinsic DC-DC converter can effectively change its conversion ratio from a buck mode into a boost mode, thereby enabling high output RF power, even at low battery voltages.

Figure 6A:
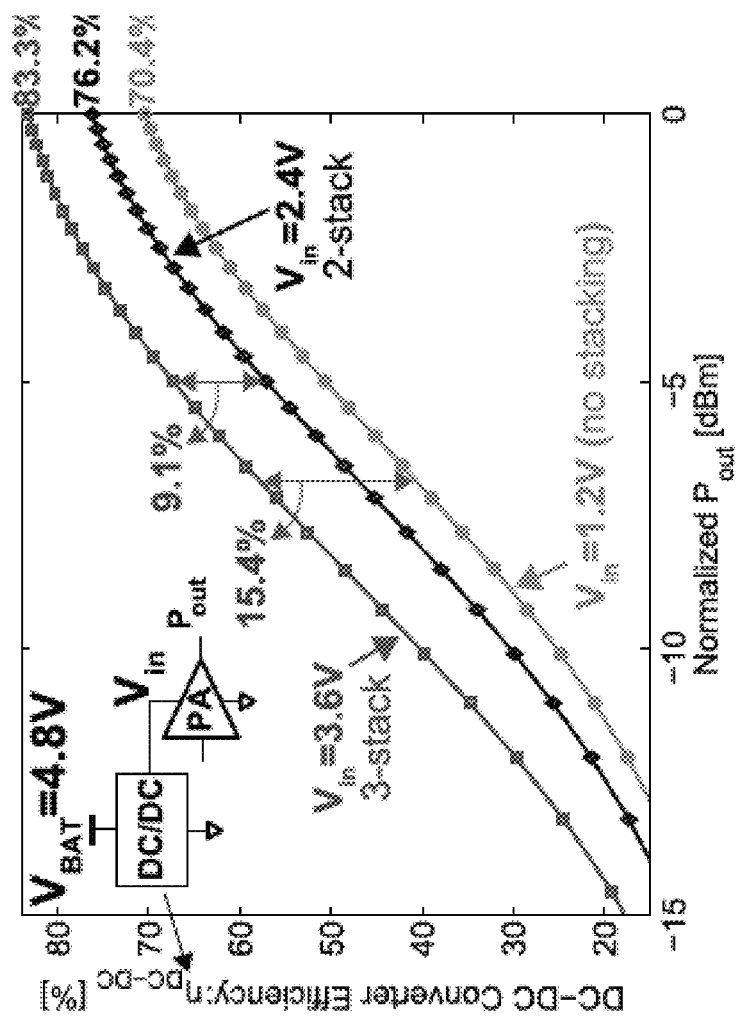
FIGS. 6A-6B illustrate simulated dc-dc conversion efficiencies of converters.
Figure 6B:
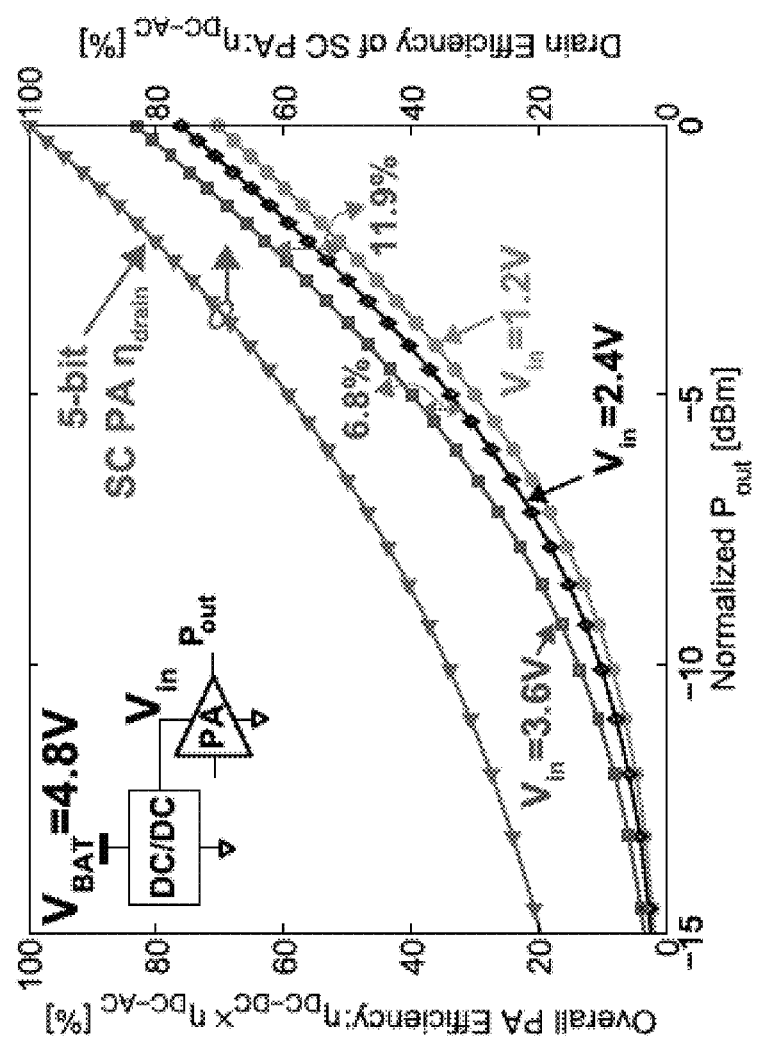

FIG. 6A shows the simulated dc-dc efficiency of a buck-boost converter optimized to supply a peak Pout=23 dBm at 1.2-, 2.4-, and 3.6-V supply voltage levels to a 5-bit digital PA implemented by stacking 1-3 PA cells (the class D cell in FIG. 2A, for example), respectively, from a 4.8-V battery. As shown, the dc-dc converter achieves 9.1% and 15.4% higher efficiency by delivering the same required $P_{out}$ at 3.6 V ($I_{in}$) instead of 2.4 V (2Iin) and 1.2 V (3Iin), respectively. Therefore, significant boost in the overall PA efficiency can be realized by reducing the forgotten dc-dc conversion loss through PA stacking. FIG. 6B shows the resulting overall PA efficiency, $\eta_{dc-dc} \times \eta_{drain}$, when a 5-bit SC PA (based upon FIG. 2B, but for 5-bit resolution) is implemented by stacking 1-3 PA cells while powering the entire stack at 1.2, 2.4, and 3.6 V, respectively, from the dc-dc converter with the efficiency profile shown in FIG. 6A. The overall efficiency is enhanced by ~6.8% and ~11.9% across Pout levels down to −9 dB. This results in above 5.8% improvement in the average efficiency of a 9-dB PAPR output modulated signal.

Figure 7A:
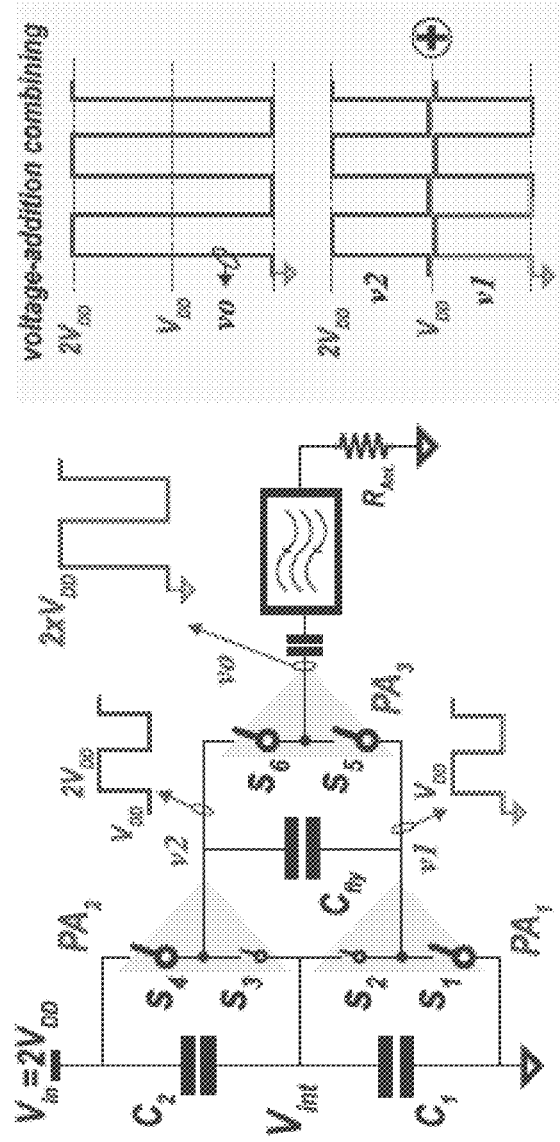
FIG. 7A illustrates a preferred HoC (house of cards) topology that can generate high RF voltages using only scaled thin-oxide CMOS transistors, and FIG. 7B show the resulting phases when φ is low and high
Figure 7B:
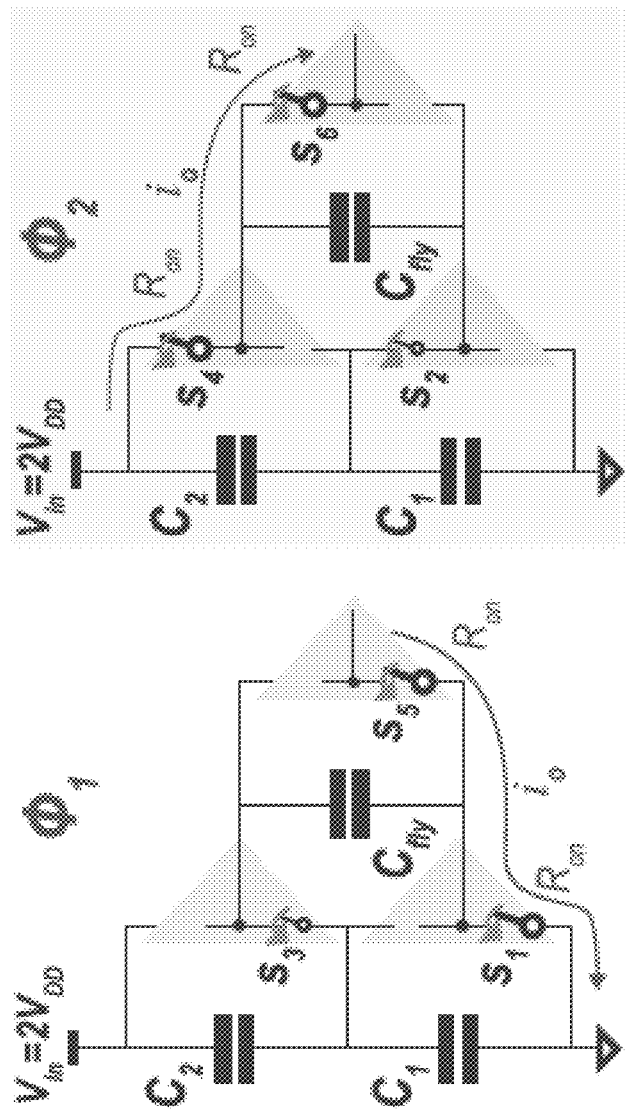

FIG. 7A illustrates a preferred HoC topology that can generate high RF voltages using only scaled thin-oxide CMOS transistors, and FIG. 7B show the resulting phases when ϕ is low. To achieve an amplitude of $4/\pi V_{DD}$, the supply and the GND of a third PA cell, PA3, are switched with respect to the power source $V_{in}$ rails through PA2 and PA1 switches, respectively, to provide voltage addition of the initial (PA1 and PA2) ladder and PA3 outputs. The topology arranges the PA cells in a HoC topology, where PA3 acts as a "flying domain". See, L. G. Salem, J. G. Louie, and P. P. Mercier, "Flying-domain DC-DC power conversion," IEEE J. Solid-State Circuits, vol. 51, no. 12, pp. 2830-2842, December 2016. During $\phi_1$ ($\phi_2$), in FIG. 7B, the odd (even) numbered switches are on, and hence, RL is connected to GND (Vin).

The equivalent output resistance, Rout, of such a PA is $2R_{on}$, where $R_{on}$ is the ON-resistance of switches s1, s5, s4, and s6. The charge delivered to the output load RL does not pass through the inner switches s2 and s3, which are only used to balance capacitors $C_1$ and $C_2$ using $C_{fly}$ during transients. As a result, switches s2 and s3 can be the minimum width offered by the CMOS process. Essentially, switches (s1 and s4) and (s5 and s6) form two class-D PA cells connected in cascade, where both handle the total output current, $i_o$, and are therefore termed ac PA cells. Through switches s2 and s3, $v_1$ and $v_2$ are never left floating, unlike what would occur in a conventional cascaded switcher, and hence the present topology guarantees reliable operation without exceeding any device voltage rating, all in a self-contained solution without any bias circuitry or added complexity.

Figure 8A:
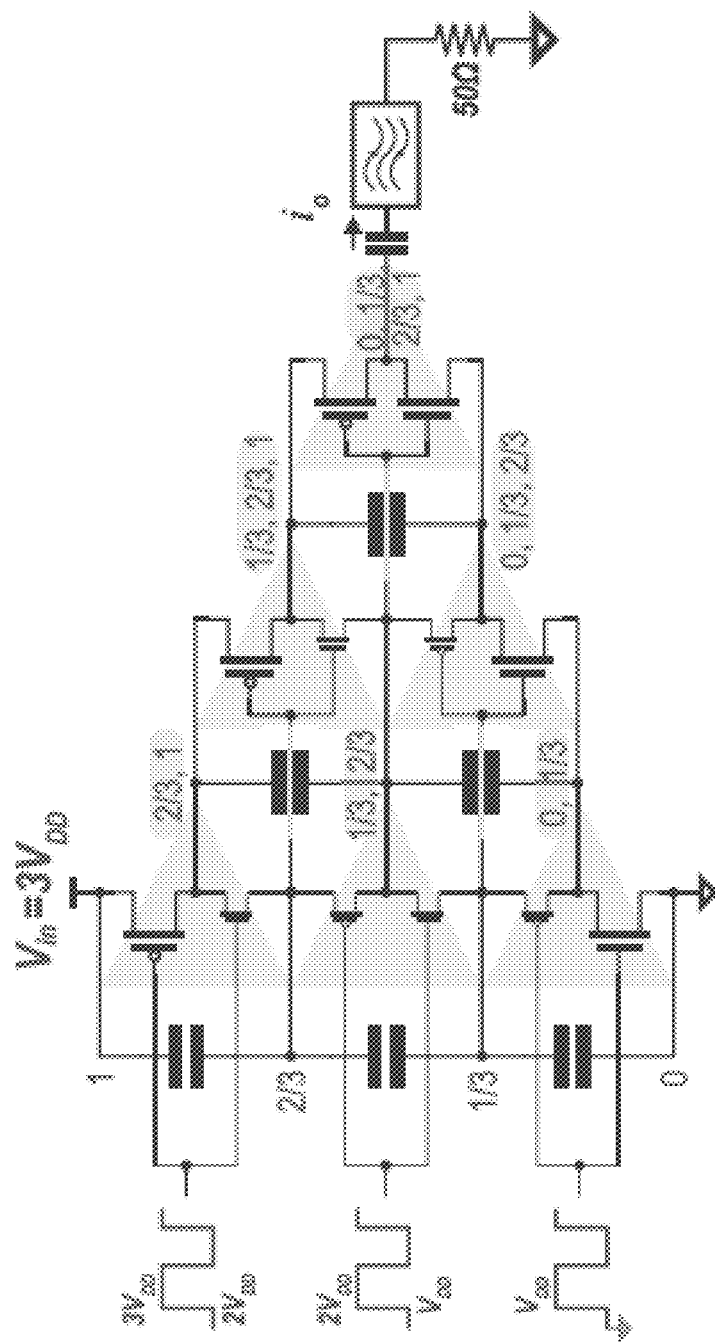
FIGS. 8A and 8B illustrate that the topology can be generalized to simultaneously realize a 1:N voltage step-up ratio and N PA power combining, with a 1:N ratio transformation (in this example, N=3)
Figure 8B:
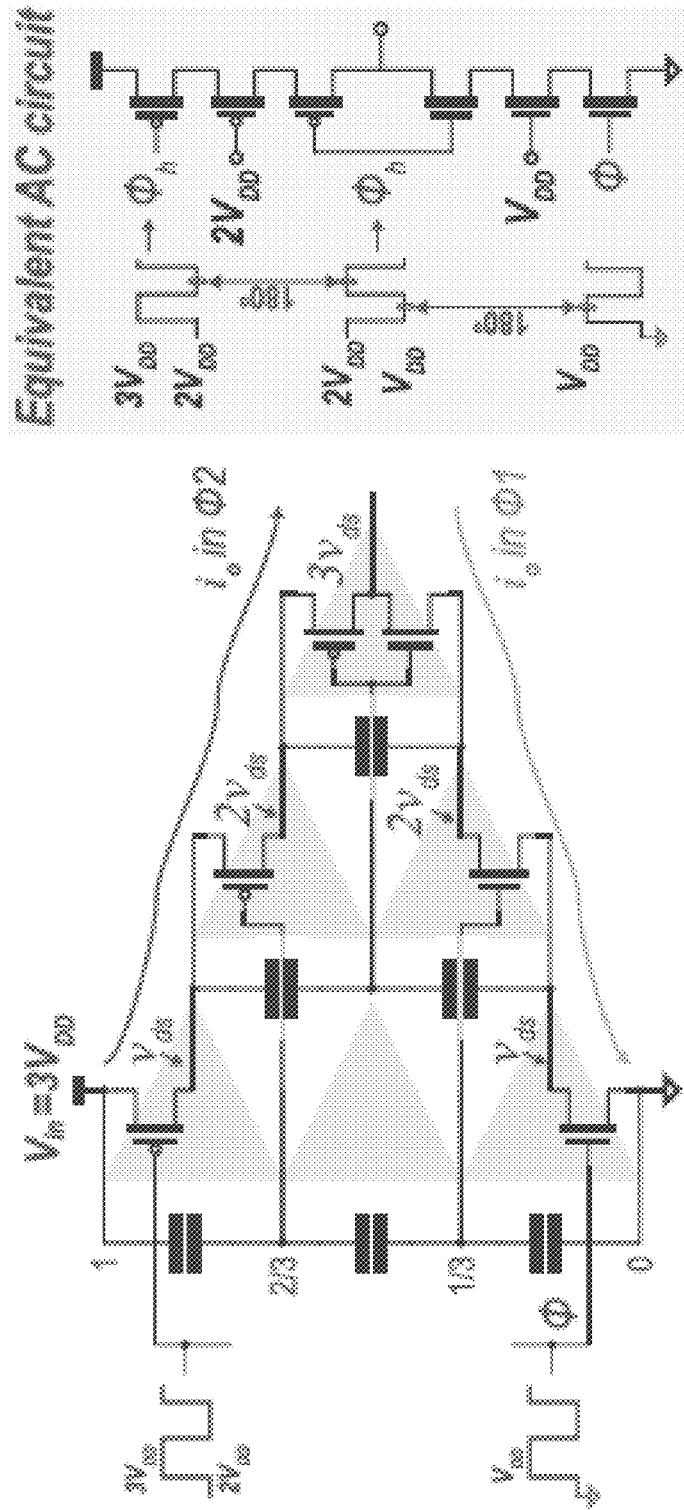

FIGS. 8A and 8B illustrate that the topology can be generalized to simultaneously realize a 1:N voltage step-up ratio and N PA power combining, with a 1:4 ratio transformation being shown. The operation is as described with respect to FIG. 1C, and includes additional ladder stages. FIG. 8A illustrates a preferred three-stack HoC PA of the invention. FIG. 8B illustrates fundamental ac PA cells (i.e., the "slices" of FIG. 8A without the interior transistors used for DC voltage balancing) and the respective gate/drain voltages to provide safe, aligned operation through clamping capacitors while performing series power combining. The topology realizes $NV_{DD}$ swing from N ac $V_{DD}$-rated PA cells by flying an entire N−i-stacked-PA ladder through the switches of a prior N−i+1-stacked-PA, with the N−i-ladder input gates clamped to the intermediate nodes of the prior ladder, recursively, until the resulting lower stack PA is a single PA cell, as shown in FIG. 8A for N=3. The commutation of the switches permits the addition of the voltage swings of the N ac PA cells (i.e., voltage-domain combining) In addition, each flying PA-ladder provides automatic dc voltage balancing of the stacked domains of the prior ladder. Each clamping capacitor, dc or flying, is automatically balanced to ~$V_{DD}$ at steady state. With the gate connection of each subsequent stage's transistors connected to the DC rail of the previous stage, the cascaded PA-ladders, in FIG. 7A, are switched in a domino falling fashion with the annotated transient states of the intermediate nodes. As a result, the voltage swing at the gate and drain of each switch is perfectly aligned through the clamping capacitors to guarantee safe operation in a robust digital manner, as represented in FIG. 8B. Because the gate of each transistor in FIG. 7A is connected to the drain/output of the prior stage without ac-coupling, the circuit can be very compact and also aligns the voltage across the capacitors.

Figure 9A:
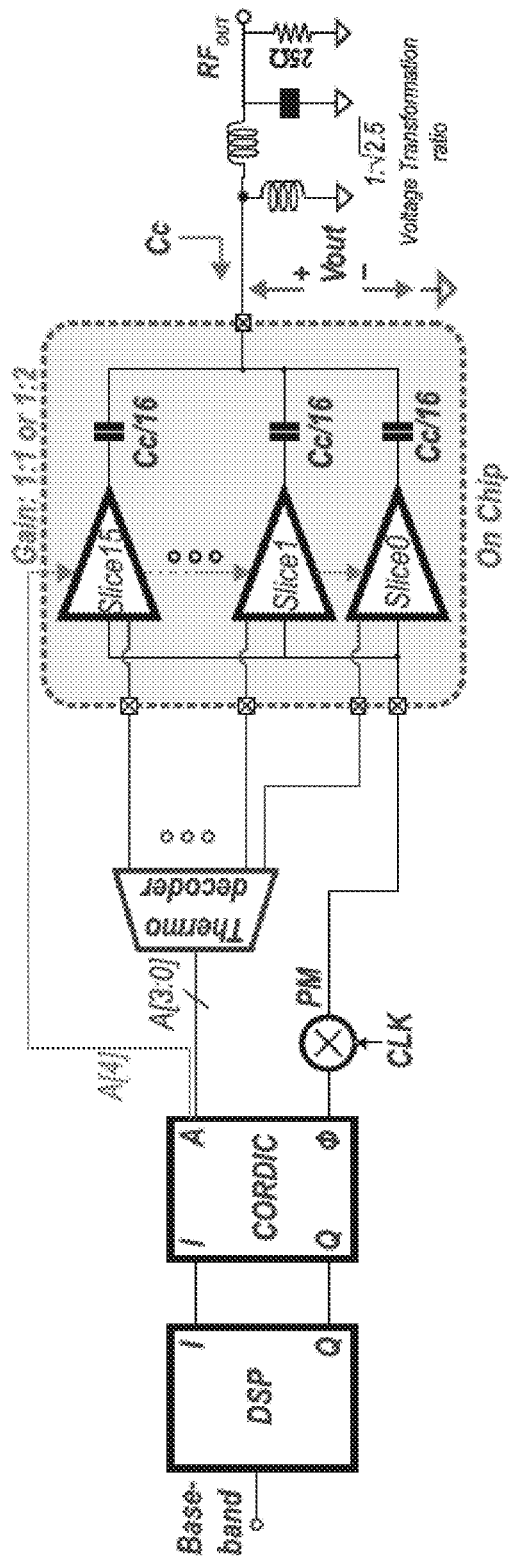
FIGS. 9A and 9B illustrate a preferred embodiment of how the recursive HoC amplifier architecture could be used in a polar power amplifier (noting that a Cartesian or other approach could also work)
Figure 9B:
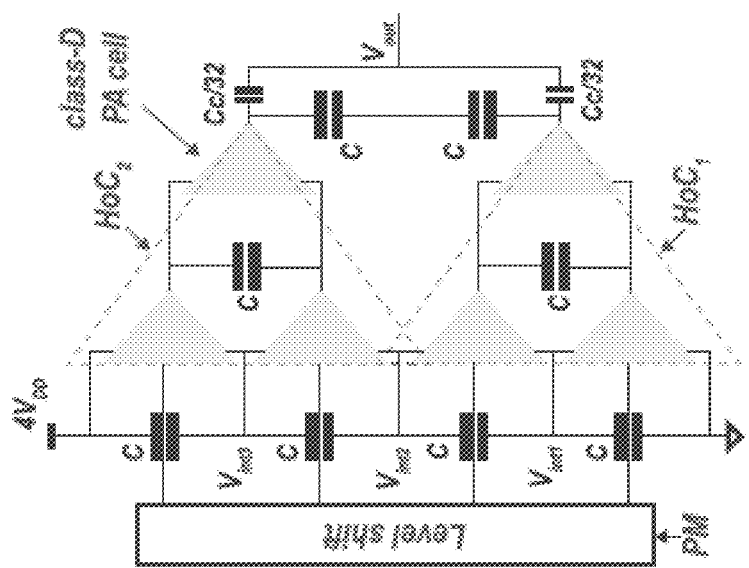

FIGS. 9A and 9B illustrate a preferred embodiment recursive HoC amplifier architecture. FIG. 9A is a block diagram of a single-ended HoC amplifier (actual implementation is differential), and FIG. 9B shows a schematic diagram of one of the HoC slices from FIG. 9A. FIG. 9A shows the two-stack by two-cascade recursive HoC PA powered directly at Vin=4.8 V using $V_{DD}$=1.2 V thin-oxide transistors in 65 nm. The input baseband signal is oversampled and raised-cosine filtered using a DSP to generate the in-phase (I) and quadrature (Q) signals. Using a CORDIC algorithm, the digital I and Q signals are converted into a 5-bit envelope (A[4:0]) and phase (φ) components. A square carrier at $f_o$ is phase modulated by the produced phase signal through a mixer.

The generated PM clock is used to drive 16 PA slices, each sized to have conductance $G_{on}/16$, and each implementing a two-stack two-cascade HoC PA. As shown in FIG. 8B, six $V_{DD}$-rated class D PA cells are used to implement each HoC slice. Three class-D cells are arranged in a two cascade HoC topology to establish two 2 VDD swing PAs: HoC1 and HoC2, which are then stacked on top of each other to block Vin=4 $V_{DD}$. The generated constant-envelope PM clock between (GND and $V_{DD}$) is level shifted through a star-connected shifter to in-phase clocks switching between ($V_{DD}$ and 2 $V_{DD}$), (2 $V_{DD}$ and 3 $V_{DD}$), and (3 $V_{DD}$ and 4 $V_{DD}$). The 16 PA slices share the same intermediate dc nodes ($V_{int1}$, $V_{int2}$, and $V_{int3}$). The output of each two-cascade HoC PA of the 32 (i.e., 16 slices, two 2-cascade HoC PAs each) is coupled to the output $V_{out}$ through a $C_c/32$ capacitor, which forms a 4-bit (16 slices) unary-sized RF-DAC.

Based on the required envelope amplitude, fetched at the sample rate, the 16 HoC slices are selectively enabled through a 4-bit thermometer decoder to switch the bottom plates of the unary-sized MIM capacitor array, whose total capacitance is $C_c$=25 pF, at $f_o$ and with a voltage swing of $2V_{DD}$. On the other hand, bit A[4] of the envelope is employed to set the internal voltage gain of each HoC slice to one of two possible values 1:1 or 1:2. Therefore, in total, the HoC PA achieves 5-bit amplitude resolution capability. At peak power, all the HoC slices are actively switching. At back-off, the slices are gradually deactivated by connecting the bottom plate of each slice $C_c/32$ capacitors to GND to $V_{int2}$. Unlike the binary weighted RF-DAC approach, the use of unitary-sized amplifier cells enables better differential nonlinearity (DNL) and integral nonlinearity (INL) performance. In addition, it reduces the glitches at the sampling instants where only one HoC slice is deactivated/activated as the digital envelope changes by one LSB, further improving the linearity and dynamic performance of the overall PA.

An output inductive bandpass filter is used to resonate with $C_c$ and establishes an LC impedance transformation network. As shown in FIG. 9A, a two-stage LC impedance transformation network is employed to transform the 25-Ω load resistance (50-Ω antenna through a balun) to 10Ω (i.e., an impedance transformation 1:2.5) to generate the desired 23-dBm total output power. Thus, each LC matching stage should provide $\sqrt{2.5}$ of impedance transformation ratio for maximum bandwidth. However, the first LC stage is designed to provide an impedance transformation ratio of ~1.8, which is a little larger than $\sqrt{2.5}$ for lower DAC charge-sharing loss while maintaining a reasonable bandwidth. Therefore, the desired loaded quality Q1 of the first LC matching stage is ~0.89, which sets the value of $C_c$ as 25 pF at 0.72 GHz for application in the white-space mobile market.

Figure 10:
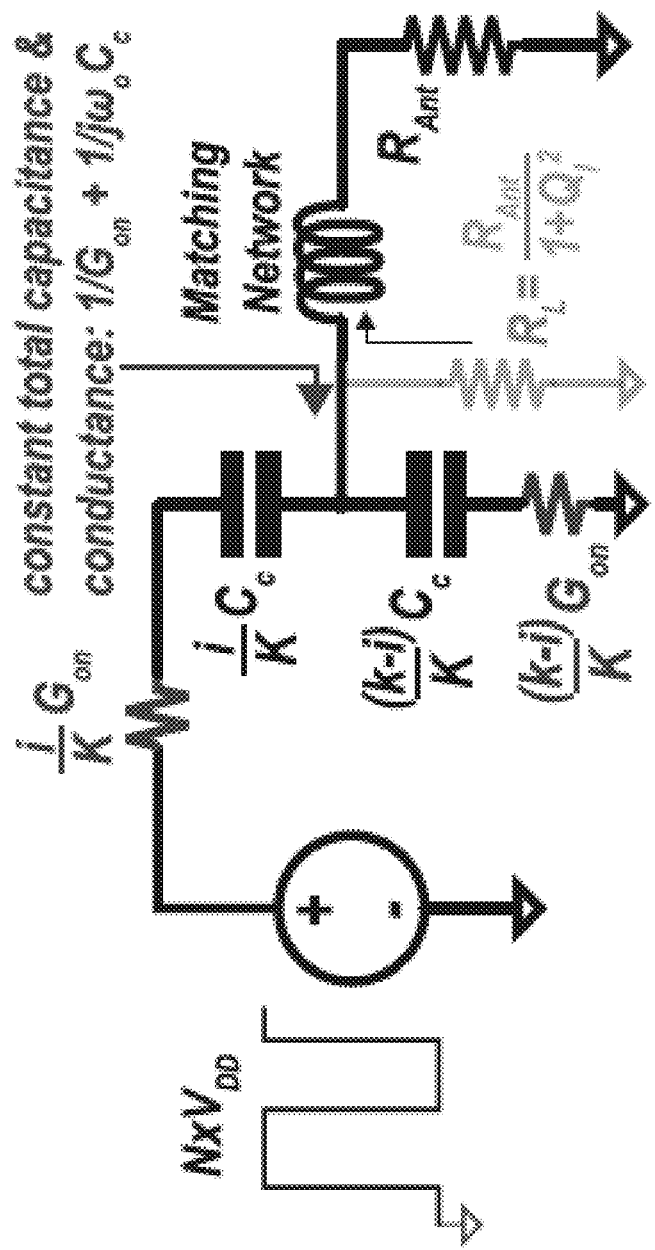
FIG. 10 shows an equivalent circuit of the implemented SC HoC PA of FIGS. 9A and 9B FIGS. 11A-11B illustrate a preferred a strategy for reconfiguring the HoC slice transformation ratio from 1:2 to 1:1 to achieve high efficiency at backoff.

HoC RF-DAC Drain Efficiency: FIG. 10 shows an equivalent circuit of the implemented SC HoC PA of FIGS. 9A and 9B. Modulating the output amplitude by controlling the number of actively switching PA slices essentially resembles a controllable capacitive voltage divider to a constant-envelope $2V_{DD}$ square wave. K is the number of unary-sized slices to enable $\log_2(K)$-bit resolution. As the envelope code, i, is increased, more capacitors are switched between GND and $2V_{DD}$ through an $iG_{on}/k$ conductive path, while K–I capacitors are statically pulled down through a $(K-i)G_{on}/K$ path. Since the input port of the employed matching network is inductive, the matching can be considered as high-impedance during the fast transition of the input square signal. Therefore, the output voltage $V_{out}$ is determined by the voltage divider as:

$$V_{out} = \frac{2}{\pi}\frac{i}{k} 2 \times V_{DD} \quad (1)$$

The series combination of the capacitor array $i(K-i)/K^2 c_c$ is charged and discharged once per the RF cycle. The array charge-sharing loss $P_{Cs}$ is:

$$P_{Cs} = \frac{i(K-i)}{K^2} C_c (2 \times V_{DD})^2 f_o \quad (2)$$

By employing a series inductive reactance, the series capacitive reactance $$\frac{1}{\omega_0 C_c}$$

can be cancelled at $f_o$ to provide a significant reduction in the employed $C_c$, which reduction is partially dependent on the unloaded quality of the employed inductor, $Q_{ind}$. Through a larger inductance L at a given $R_L$, a higher loaded quality factor $$Q_l = \frac{\omega_o L}{R_L} = \frac{1}{\omega_o C R_L}$$

can be realized. This results in a smaller array capacitance, and hence, $P_{cs}$ can be reduced, which can be demonstrated using the following equation from [S.-M. Yoo, J. S. Walling, E. C. Woo, B. Jann, and D. J. Allstot, "A switched-capacitor RF power amplifier," IEEE J. Solid State Circuits, vol. 46, no. 12, pp. 2977-2987, December 2011]:

$$\eta_{drain} = \left(1 + \frac{\pi}{4}\frac{(K-i)}{i}\frac{1}{Q_l}\right)^{-1}$$

Magnetic-Less Implicit Class-G Swapping Doherty for High Average Efficiency.

Figure 11A:
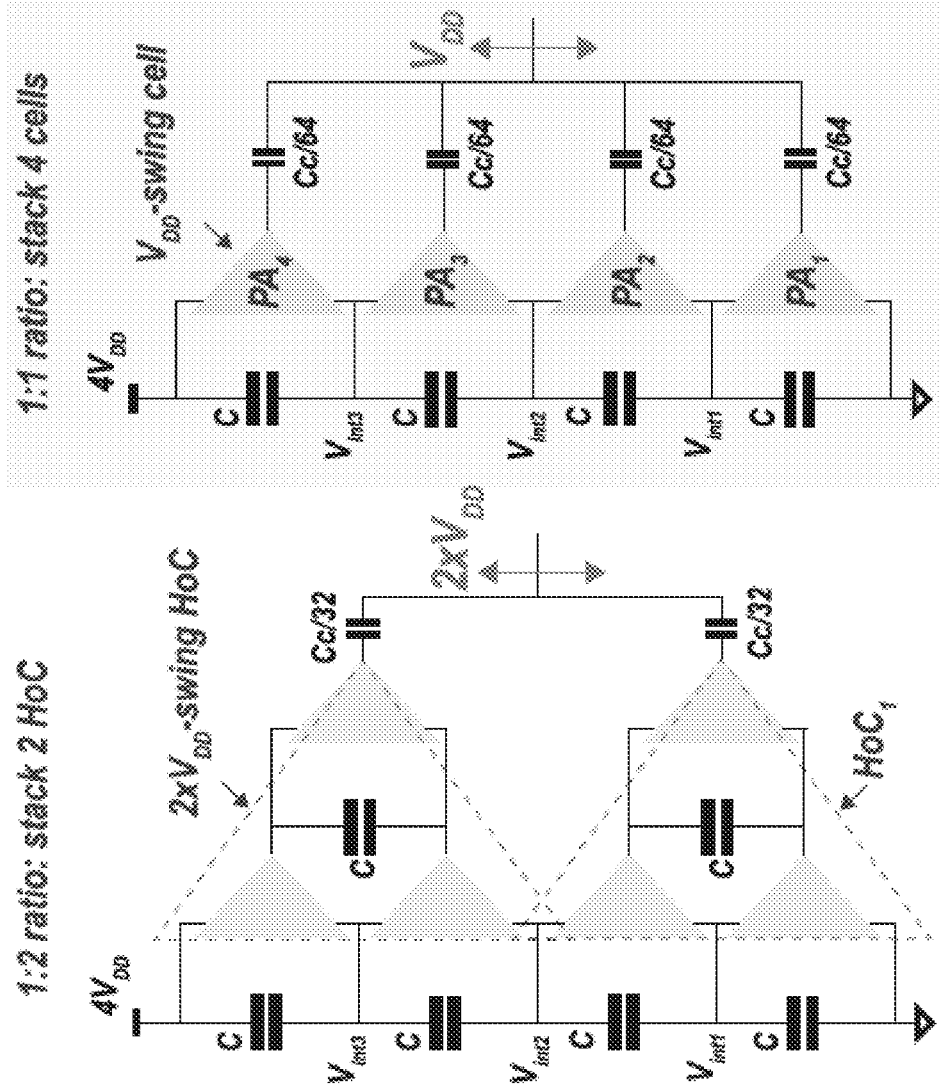
Figure 11B:
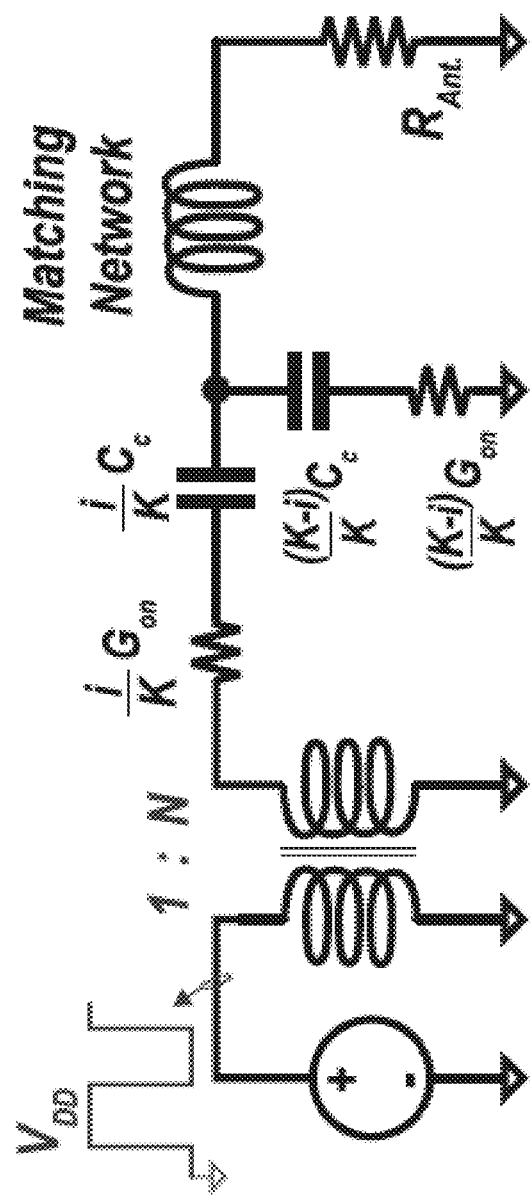

FIG. 11A shows a strategy for Reconfiguring the HoC slice transformation ratio from 1:2 to 1:1 to achieve high efficiency at backoff. FIG. 11B shows the equivalent circuit. Efficiency at back-off can be maintained by re-configuring each PA slice, containing two stacked HoC cells [HoC1 and HoC2 in FIG. 11A (1:2 ratio)] with 2-$V_{DD}$ output swings, into a stack of four class-D PA cells whose outputs are capacitively coupled to provide $V_{DD}$ output swings. In this manner, the charge-sharing losses of the capacitor array, $P_{cs}$ in Equation (2), can be scaled by the same factor as the output power at 6-dB back-off (i.e., four times), and hence, the HoC PA realizes a second efficiency peak at 6-dB back-off that matches the peak Pout efficiency HoC. Since the overall PA supply voltage, Vin=$4V_{DD}$ is not changed, the reconfigurable HoC amplifier can be considered as a solid-state RF impedance transformer that achieves two voltage transformation ratios, 1:2 and 1:1, as in FIG. 11C. The available two transformation ratios boost the achievable resolution by 1 bit, and thus, 0≤i≤2K.

The MSB of the envelope code, A[4] in FIG. 9A, is used to set the transformer ratio. The remaining four least significant bits, A[3:0], are used to enable fine-grain amplitude resolution through the formed RF-DAC. Preferred options for accomplishing fine-grain amplitude modulation include: Class-G-like and Doherty-like, which differ in how to utilize the inactive slices.

Class G Like HoC Back-Off

At the 1:2 transformation ratio (i.e., A[4]=1), A[3:0] can be employed through the decoder in FIG. 9A to adapt the number of actively switching slices with $2V_{DD}$ swings, i–K, while the remaining 2K–i slices (where K≤i≤2K) are statically connected low. In this case, the drain efficiency is similar to Equation (3) but replacing K with 2K. The HoC suffers from a discontinuous efficiency profile near the transition point in between the two transformation ratios, since at the 6-dB back-off point, all the capacitors $C_c$ in the HoC array are actively switching from an input $V_{DD}$ voltage swing with zero charge-sharing loss and, therefore, the PA efficiency jumps to the ideal 100% value at the –6 dB code. This resembles the operation of a conventional class-G PA that operates through a 100%-efficiency dc-dc converter that produces the –6 dB $V_{in}/2$ supply.

Doherty-Like HoC Back-Off

Figure 12B:
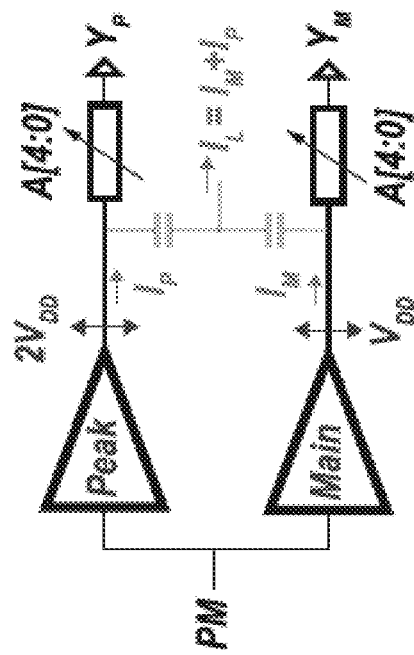
FIGS. 12A-12D illustrate a preferred Doherty-like HoC back-off strategy.
Figure 12A:
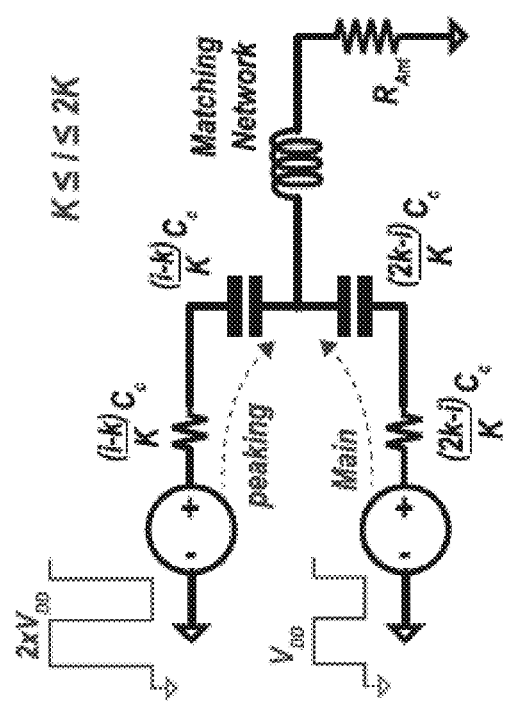
Figure 12D:
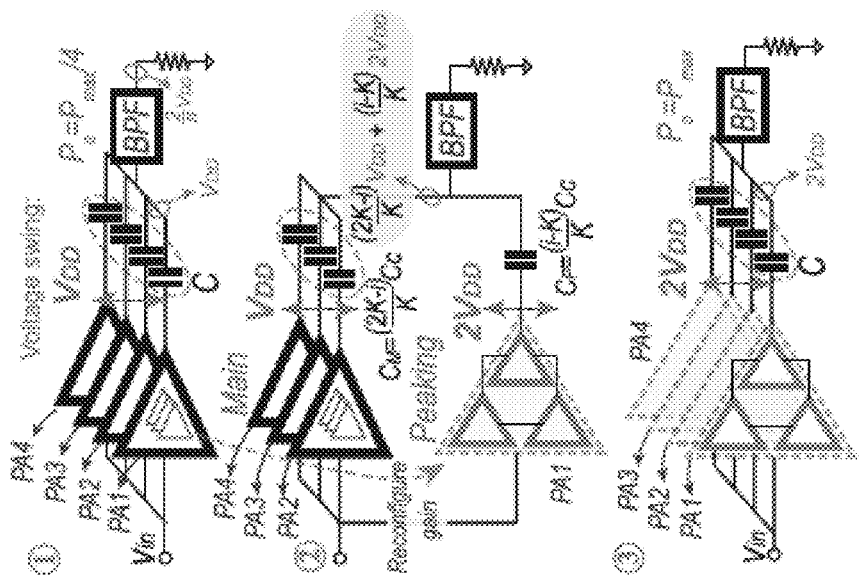
Figure 12C:
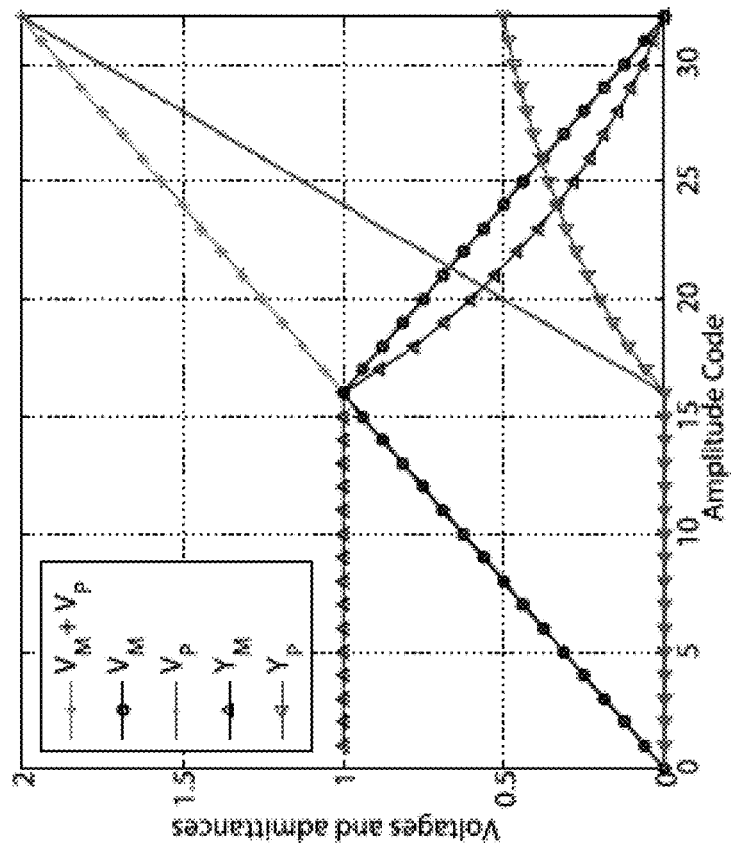

FIGS. 12A-12D illustrate the Doherty-like HoC Back-off. FIG. 12A is the equivalent circuit of the HoC while generating amplitudes between the 1:1 ("main") and 1:2 ("peaking") transformations ratios. FIG. 12B illustrates load-pull characteristics of the HoC for K≤i≤2K. FIG. 12C plots normalized voltages and admittances of the main and peaking amplifiers. FIG. 12D is an illustration of swapping Doherty operation for maximum area utilization: (1) when the peaking PA is virtually off, (2) when peaking PA acts as an "active load" for the main amplifier, and (3) when peaking PA is fully on, $P_{out}=P_{max}$. To improve efficiency at backoff, when A[4]=1, the 2K−i inactive slices instead switch the bottom plate of their coupling capacitors with a swing of $V_{DD}$ rather than being static. Essentially, the input signal is amplified through two voltage-mode PA paths, a main amplifier path with $V_{DD}$-swing and a peaking amplifier path with $2V_{DD}$-swing, as shown in FIG. 12A. The two paths are simply combined through a programmable capacitive voltage divider network to generate amplitudes between $V_{DD}$ and $2V_{DD}$, according to A[3:0], and the output voltage becomes:

$$V_O = \frac{2}{\pi}\left(\frac{i-K}{K}2 \times V_{DD} + \frac{(2K-i)}{K}V_{DD}\right) \quad (4)$$

for K≤i≤2K. This way, the K-capacitor array is charged and discharged through only the amplitude difference between the two amplifiers, $V_{DD}$, instead of $2V_{DD}$ in the conventional approach, reducing the charge-sharing losses by four times, and enhancing the efficiency profile between the two ratios to exactly follow a Doherty back-off profile.

Such operation can be compared to a two-way Doherty configuration, where capacitive load pull of the main amplifier occurs. However, rather than treating the two amplifiers in the two-way Doherty as current sources, the main and peaking amplifiers are employed as voltage sources of different amplitude levels VM=(2K−i)/K×$V_{DD}$ and VP=(i−K)/K×2VDD, respectively. The present circuit performs voltage-domain combining, and the load admittance, rather than impedance in current-mode Doherty, is gradually lowered once the auxiliary amplifier is ON, as in FIG. 12B and FIG. 12C. Unlike the classical Doherty implementations that disable the peaking amplifier at back-off, wasting silicon area, a "swapping Doherty" architecture is provided in the preferred embodiment, where at back-off, the peaking amplifier slices are reconfigured (i.e., swapped) to act as the main amplifier, realizing 100% resource utilization, as shown in FIG. 12D. The efficiency under such operation becomes:

$$\eta_{drain}\bigg|Doherty = \left(1 + \frac{\pi}{4}\frac{(i-K)(2K-i)}{i^2}\frac{1}{Q_1}\right)^{-1} \quad (5)$$

for K≤i≤2K. Continuous efficiency transition through a second amplitude coding scheme in a class-G SC PA has been reported previously. See, S.-M. Yoo et al., "A class-G switched-capacitor RF power amplifier," IEEE J. Solid-State Circuits, vol. 48, no. 5, pp. 1212-1224, May 2013.

However, such a conventional class-G PA with multiple supplies cannot achieve the efficiency profile of the present Doherty-like configuration even with the discussed Doherty amplitude coding. The reason is that the secondary efficiency peak at 6-dB back-off is reduced by the cascaded losses of the back-off dc-dc converter. By adding the normalized loss incurred for supplying the power of the main PA, the efficiency of such approach can be given by:

$$\eta_{drain} = \left(1 + \frac{K(2K-i)}{i^2}\left(\frac{1}{\eta_{dc-dc}} - 1\right) + \frac{\pi}{4}\frac{(i-K)(2K-i)}{i^2}\frac{1}{Q_1}\right)^{-1} \quad (6)$$

On the other hand, through the implicit 100% dc-dc conversion, the present HoC topology can realize the exact two-way Doherty efficiency profile without an extra dc-dc converter or any bulky transformer.

Recursive HoC Slice Circuit Implementation Architecture

The present architecture leverages dynamic reconfiguration of individual slices between ratios to achieve Doherty-like back-off. It is important to achieve such reconfiguration without exceeding device ratings or wasting area, while still maintaining the same $R_{out}$ across all reconfiguration states to thereby avoid AM-AM and AM-PM distortion.

Figure 13A:
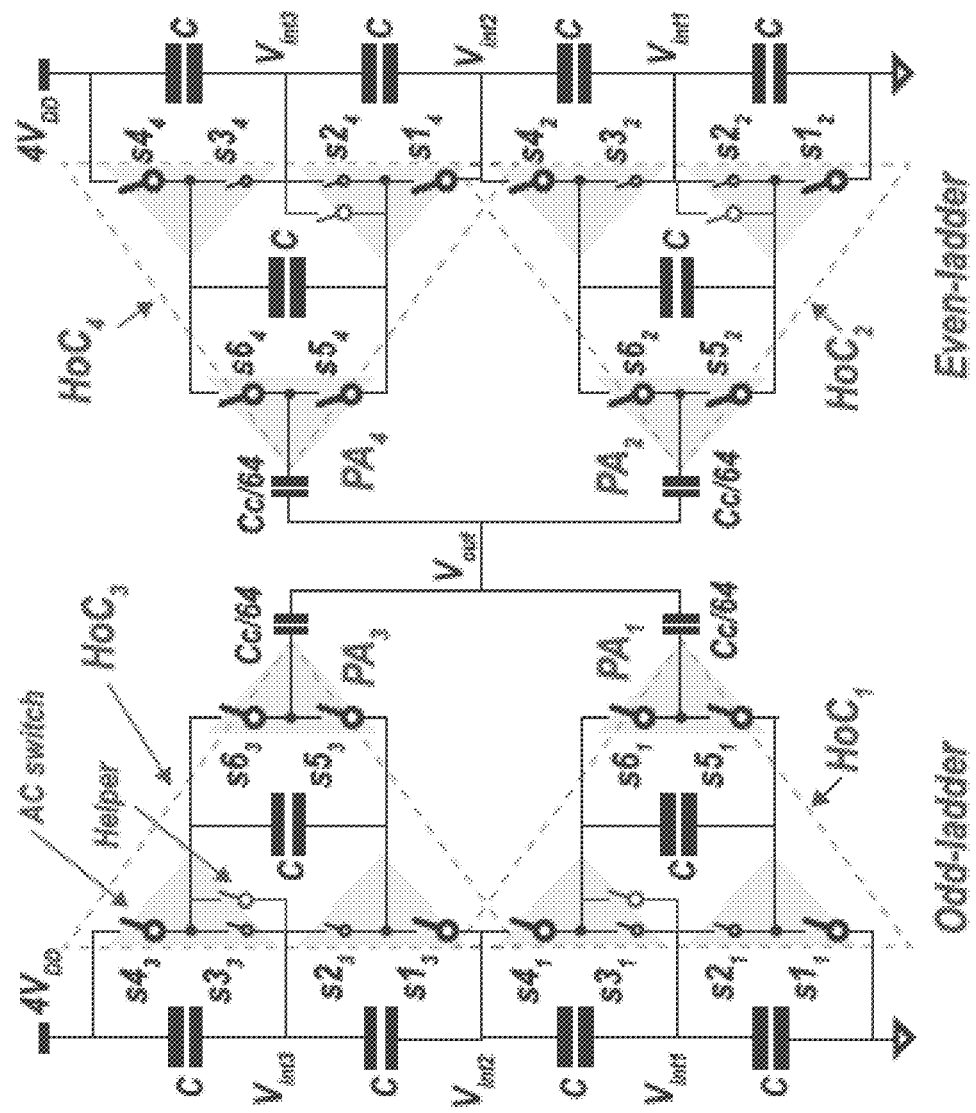
FIGS. 13A and 13B respectively illustrate a preferred recursive reconfiguration architecture of an HoC slice and the HoC slice in a 1:2 ratio case
Figure 13B:
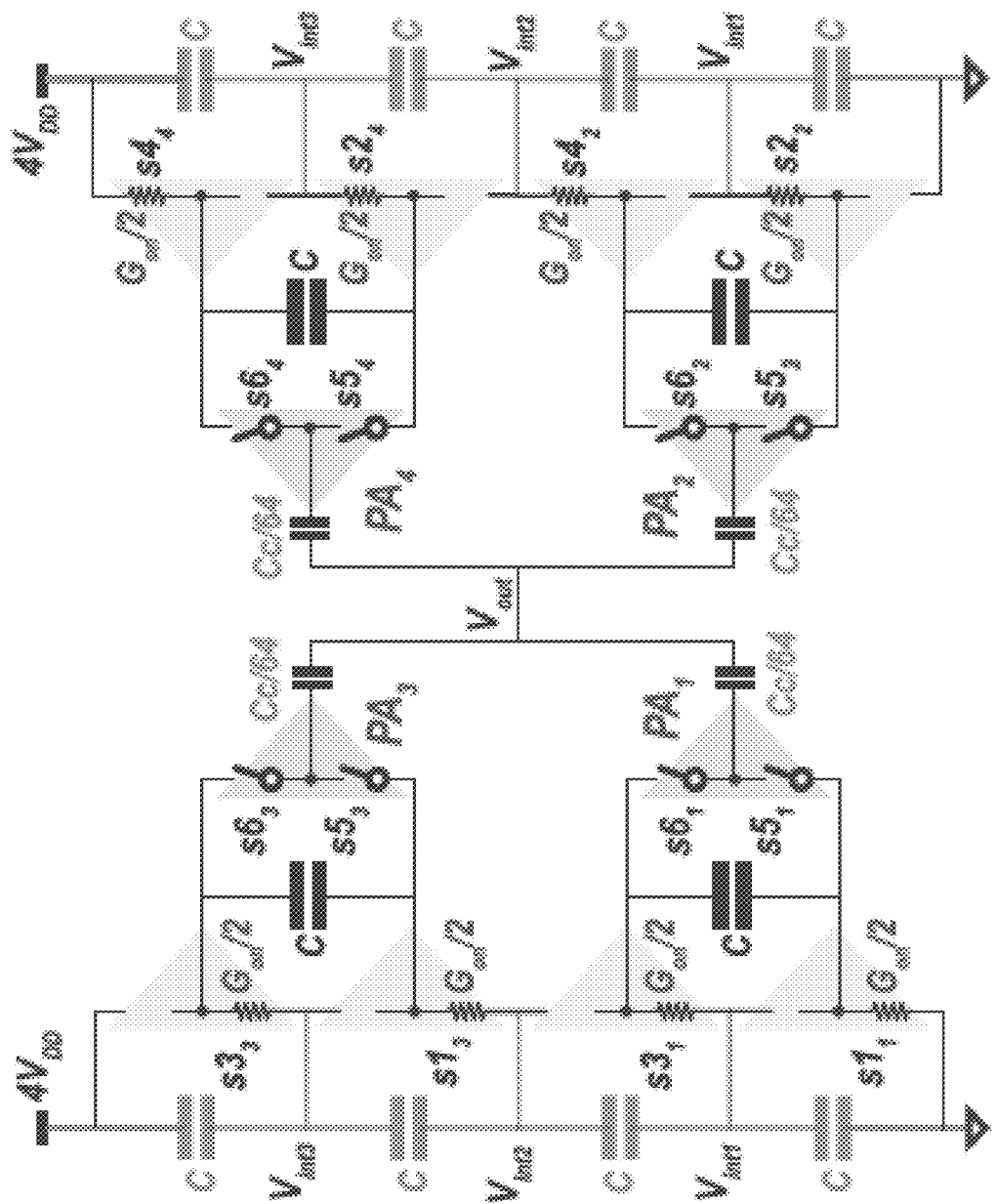

For achieving those goals, FIGS. 13A and 13B respectively illustrate a preferred recursive reconfiguration architecture of an HoC slice and the HoC slice in the 1:1 ratio case. For clarity of illustration, the output-side stacked capacitors of FIG. 9B are omitted. FIG. 13A shows the switch diagram of the experimentally implemented slice architecture used to realize the two reconfigurable transformation ratios, 1:1 and 1:2. Although six $V_{DD}$-rated class D PA cells are only technically necessary to implement each two-stack two-cascade HoC slice in FIG. 9B, 12 cells (such as the D class cell in FIG. 2A) are used to permit recursive reconfiguration with fixed $R_{out}$, without exceeding the device ratings, and without disabling or wasting silicon area. Each recursive HoC slice is implemented through two parallel two-stack two-cascade HoC ladders. The intermediate nodes $V_{int1}$, $V_{int2}$, and $V_{int3}$ are tied together in the two parallel HoC ladders, while the output of each of the four 2-cascade HoC PAs is coupled to $V_{out}$ via $C_c/64$ capacitors.

Each two-cascade HoC comprises six switches. Each ac switch is assigned $G_{on}/2$ to realize an overall $R_{out}$ of $R_{on}$. The dc switch of the two available is allocated Gon/8. The four switches s31, s33, s22, and s24 include an extra helper switch, sized to be $3G_{on}/8$, to enable fixed $R_{out}$ value across both ratios. In the 1:2 transformation ratio, all the switches are operated from the input PM clock level shifted to the corresponding stacked/flying domain on-chip, while the helper switches are disabled. In the 1:1 ratio, as shown in FIG. 15B, switches s11 and s31 in HoC1 are statically turned on to connect the class-D PA1 permanently between GND and Vii, while s51 and s61 are operated through the PM clock. Similarly, switches (s13 and s33) in HoC3 (s22 and s42) in HoC2 and (s24 and s44) in HoC4 are used to permanently connect PA3, PA2, and PA4 at ($V_{int2}$ and $V_{int3}$), ($V_{int1}$ and $V_{int2}$), and ($V_{int1}$ and $V_{in}$), respectively. This way the four PA cells, PA1, PA2, PA3, and PA4, are stacked on top of each other, as shown in FIG. 11A, to provide $V_{DD}$ output voltage swing while operating from $V_{in}$, enabling high efficiency at 6-dB back-off. By statically enabling the helper switches within s31, s33, s22, and s24 at the 1:1 ratio and disabling them in the 1:2 ratio, a fixed $R_{out}$ value (equal to R.) can be realized across both 1:1 and 1:2 ratios.

Reconfigurable Class-D PA Cell Design.

Figures 14A, 14B:
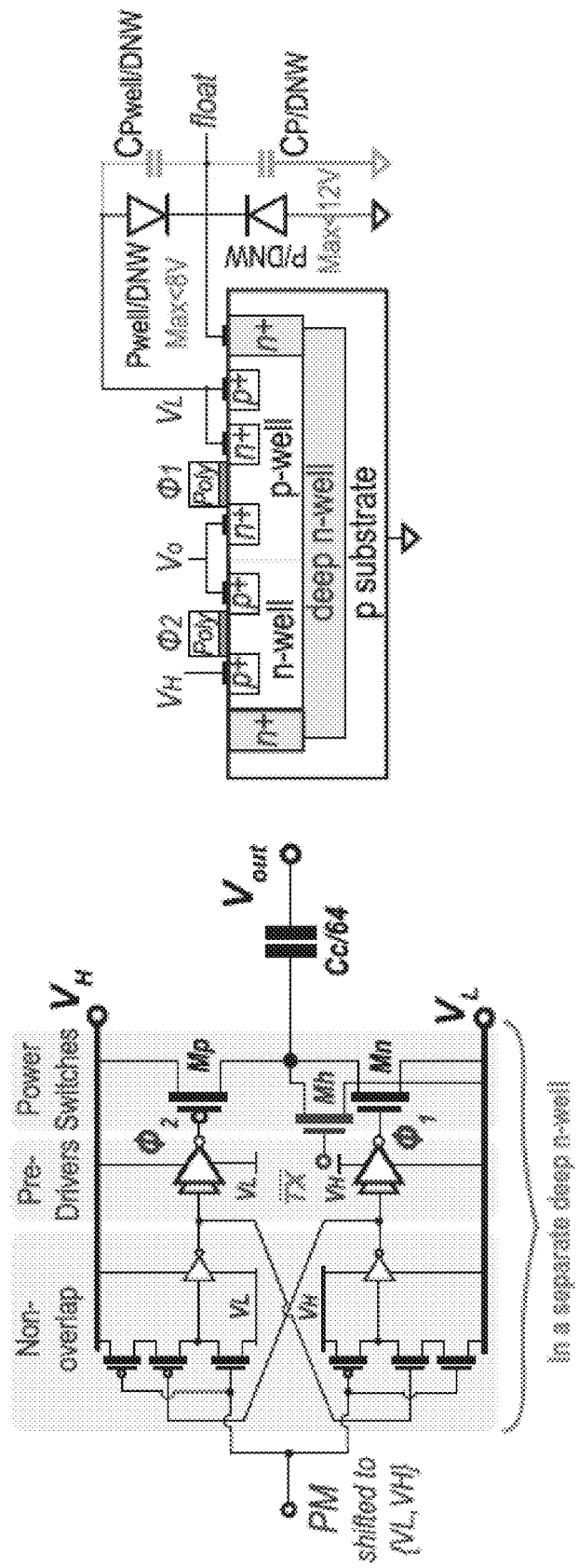
FIG. 14A illustrates an implementation of a preferred example segmented pull-down class-D cell, and FIG. 14B the preferred fabrication.
Figure 15A:
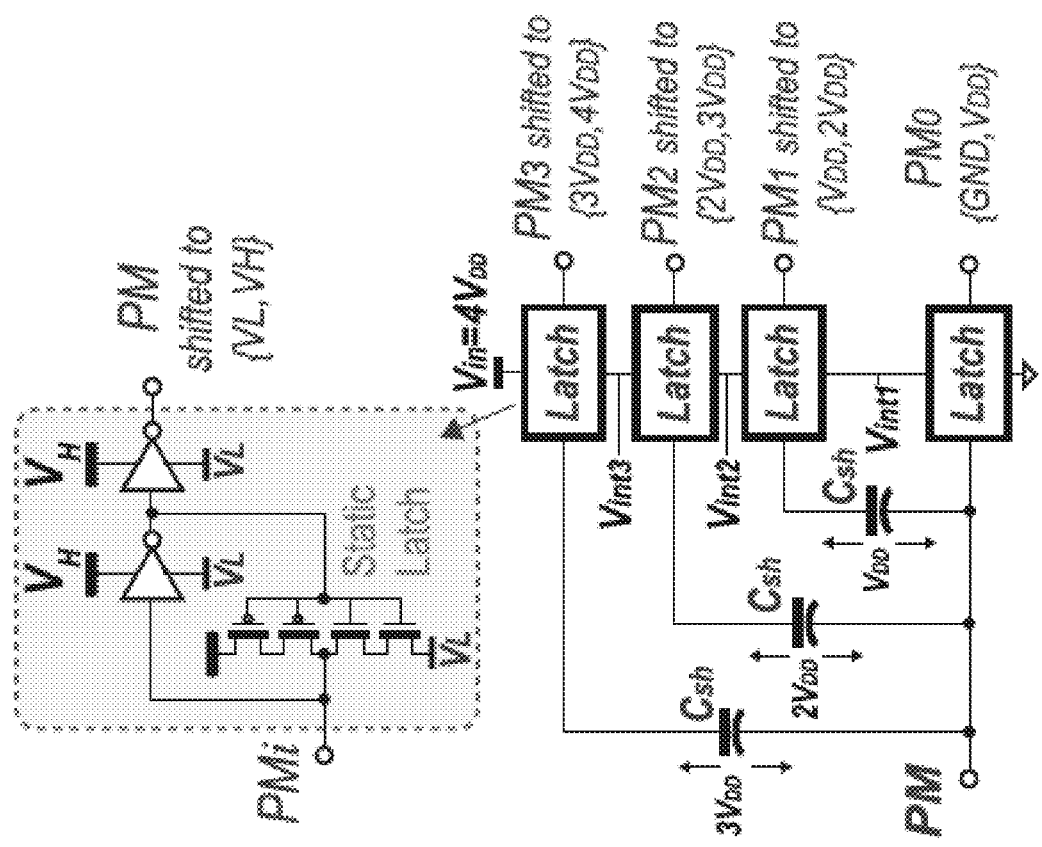
FIG. 15A illustrates a preferred star-connected capacitive level shifter and FIG. 15B the generation of clocks for recursive slices in FIG. 15A.
Figure 15B:
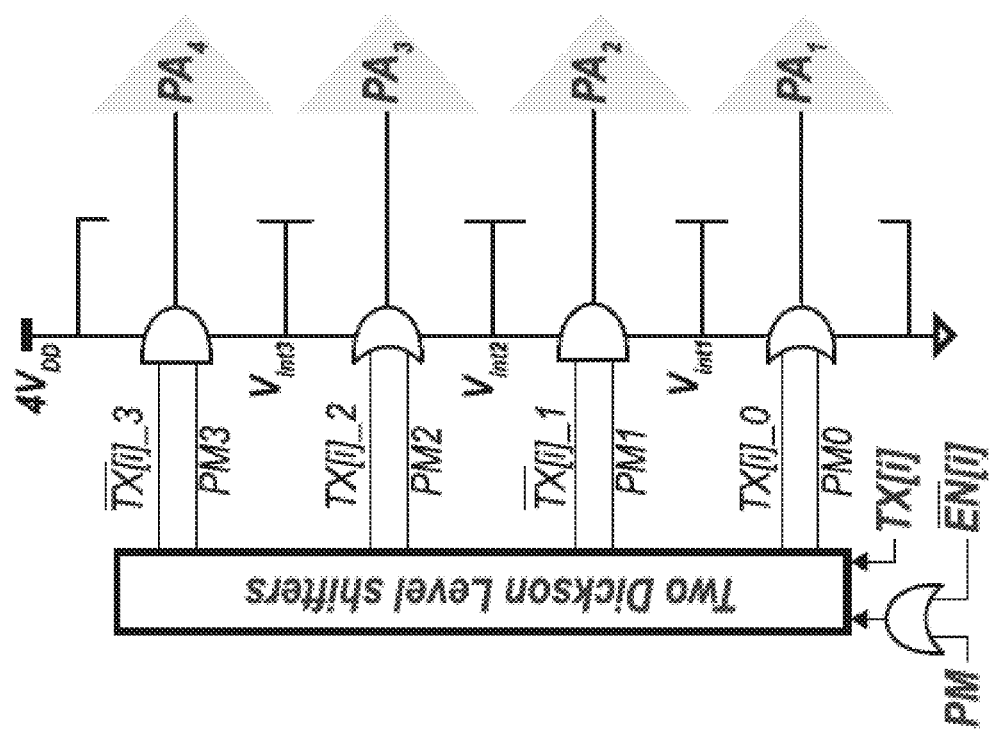

The 12 class-D PA cells used to implemented an HoC slice in FIG. 15A are divided into three categories based on the required digital conductance programmability: nominal, segmented pull-up, and segmented pull-down. The segmented configurations include an additional pull-up/pull-down helper switch over the nominal cell. FIG. 14A illustrates an implementation of a preferred example segmented pull-down class-D cell. The other cell configurations can be realized in a similar way. In FIG. 14A, two non-overlapping clocks, $Ø_1$ and $Ø_2$ are generated from the received level-shifted PM signal through three-transistor inverters [L. G. Salem, J. G. Louie, and P. P. Mercier, "Flying-domain DC-DC power conversion," IEEE J. Solid-State Circuits, vol. 51, no. 12, pp. 2830-2842, December 2016] with feedback from the opposite phase to realize minimal dead time and eliminate any shoot through current. Clocks $Ø_1$ and Ø2 are provided through a cascaded chain of buffers to drive the gate capacitance of the NMOS Mn and PMOS Mp switches. The helper transistor, Mh, is applied as a static switch through the transformation ratio control bit TX, level-shifted to the corresponding stacked domain. FIG. 14B shows a preferred fabrication that places each PA cell in a separate deep n-well, with the deep n-well being floated to provide a 2× reduction in bottom parasitics.

The PA conduction RMS losses stem from the load current flow through the switches' ON-resistance and, hence, the PA equivalent $R_{out}$. The second key loss component of the PA originates from the charging and discharging of the parasitic capacitance, once per the RF cycle, of the constituent power switches, which includes the gate, drain, and body parasitics, along with the capacitors' top and bottom parasitics. Therefore, the total PA loss is set by $$P_{loss} = P_{RMS} + P_{switching\text{-}transistor} + P_{switching\text{-}capacitor}$$

$P_{loss}$ can be minimized by optimization plots of simulated overall loss (conduction and switching including capacitor parasitics) optimization plots versus the switch size and carrier frequency for a particular CMOS implementation. In addition, a noninverting buck-boost regulator can be employed, for example, to provide a fixed Vin of 4.8 V to the RHoC PA to maintain a given peak output power capability throughout battery voltage decay.

Interfacing Level Shifters

In addition to the TX signal that controls the helper switch in a static manner, an extra bit, EN, is employed to clock gate (i.e., PM gate) the whole HoC slice to statically hold the slice coupling capacitors low. Therefore, each recursive HoC slice in FIG. 13A receives two gain setting bits (EN and TX) to establish three gain states: statically holding $C_c/16$ down (0, 0), switching with $V_{DD}$ swing (1, 0), and switching with $2V_{DD}$ swing (1, 1). This can be accomplished by shifting the voltage levels of the input PM clock and the enable signal of the helper switch TX to the appropriate levels needed by all 12 PA cells.

FIG. 15A illustrates a preferred star-connected capacitive level shifter to achieve this goal. A fork-based clock tree is established through star-connected capacitor connection ($C_{sh}$=35 fF using MIM) to distribute balanced in-phase PM signals to the initial four stacked domains at each HoC ladder. FIG. 15B illustrates the generation of PM clocks for PA1, PA2, PA3, and PA4 in the recursive slice of FIG. 15A. The star connection in FIG. 15A is similar to the capacitor connection in a SC Dickson dc-dc charge pump. Unlike conventional ladder shifters which, due to the series connection of the capacitors, and therefore, the unequal reactances connecting the input clock to the inputs of the stacked domains can have large skew (40 ps in simulation), the present approach achieves low skew and requires three times less capacitance. A static latch is used to provide a low-impedance path to balance the voltage across the shifter capacitors and enable robust operation against leakage or any coupled glitches. A ½-sized inverter is used in the level shifter to establish a weak feedback in the latch that is easily overridden by the triggering input PM driver, thus reducing the required capacitance. The low, $V_L$, and the high, $V_H$, supplies of each latch are provided through two consecutive voltage levels from the following list: GND, $V_{int1}$, $V_{int2}$, $V_{int3}$, and $V_{in}$. The digital processing circuitry and the employed clock tree of cascaded buffers to distribute the PM signal are supplied from $V_{int1}$. The helper enable signal, TX, can be shifted in a similar manner for each of the four switches s2$_2$, s3$_1$, s2$_4$, and s3$_3$, (FIG. 13A-13B) where the star-connected shifter operates at the envelope sample rate. The PM input of the flying cells PA1 and PA3, in FIG. 13A, is provided through CMOS OR gates between (GND and $V_{int1}$) and ($V_{int2}$ and $V_{int3}$), while the inputs to PA2 and PA4 are supplied through an AND gate between ($V_{int1}$ and $V_{int2}$) and ($V_{int3}$ and $4V_{DD}$), as shown in FIG. 15B. When TX=1, at the 1:2 ratio, the gate terminals of (PA1 and PA2) and (PA3 and PA4) are statically connected to $V_{int1}$ and $V_{int3}$, respectively. In the 1:1 ratio, the initial four-stacked PA cells in the odd ladder are statically enabled, connecting PA1 and PA3 between (GND and $V_{int1}$) and ($V_{int2}$ and $V_{int3}$), respectively, while the PM signals are allowed through the ORs to the gate of PA1 and PA3. A similar operation follows for the even ladder. When the recursive HoC slice is deactivated through the EN signal received from the thermometer decoder in FIG. 9A, the input PM clock is gated, enabling all the NMOS switches and statically holding the output $C_c/64$ capacitors low. When reconfiguring between any two of the three states, the lead delay should be balanced by ensuring equal logic depth for the clock propagation in the 1:1 and 1:2 cases, to eliminate any AM-AM/PM distortion.

The experimental recursive SC HoC PA was implemented in an LP 65-nm CMOS process with nine metal layers. Testing showed that the PA structure achieved a nearly flat back-off between the two ratios, while conventional Doherty implementations suffer from relative efficiency loses typically of about 4-9%. The present topology also demonstrated 8.1% and 24.8% higher efficiency at peak power and 6-dB backoff, compared to an ideal class-B PA powered by an 80% efficiency dc-dc converter. The experimental HoC PA operated directly at 4.8 V battery power level without any explicit dc-dc converter, and demonstrated >40% battery-to-RF efficiency at both peak power and 6-dB back-off while enabling linear transmission of >10-MHz 16-QAM signals.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A circuit topology, comprising stacked power amplifier ladders arranged in a house-of-cards topology such that the number of stacked-domains follows a decaying triangular series N, N−1, N−2, . . . , N−i from the fixed ladder to the $i^{th}$ ladder to provide a 1: (i+1) voltage transformation ratio through voltage addition that is output via a flying domain power amplifier in each ladder and each ladder provides balancing of stacked domains of a prior ladder and combines power from all prior ladders, wherein the stacked power amplified ladders are connected directly to a battery power level without any transformer between the stacked power amplified ladders and the battery power level and wherein the stacked power amplified ladders consist of low breakdown voltage transistor switches (~1V or less) and capacitors.

2. The circuit topology of claim 1, wherein the stacked power amplified ladders are connected directly to an output RF load without any transformer between the stacked power amplified ladders and the output RF load.

3. A circuit topology, comprising stacked power amplifier ladders arranged in a house-of-cards topology such that the number of stacked-domains follows a decaying triangular series N, N−1, N−2, . . . , N−i from the fixed ladder to the $i^{th}$ ladder to provide a 1: (i+1) voltage transformation ratio through voltage addition that is output via a flying domain power amplifier in each ladder and each ladder provides balancing of stacked domains of a prior ladder and combines power from all prior ladders, wherein the stacked power amplified ladders consist of low breakdown voltage transistor switches (~1V or less) and capacitors.

4. A circuit topology, comprising stacked power amplifier ladders arranged in a house-of-cards topology such that the number of stacked-domains follows a decaying triangular series N, N−1, N−2, . . . , N−i from the fixed ladder to the $i^{th}$ ladder to provide a 1: (i+1) voltage transformation ratio through voltage addition that is output via a flying domain power amplifier in each ladder and each ladder provides balancing of stacked domains of a prior ladder and combines power from all prior ladders, wherein the house of cards topology comprises a first network, the circuit comprising a second house-of-cards topology comprising a second network, wherein the first and second networks are capacitively combined and set to generate different amplitudes to provide a voltage-mode back-off.

5. A circuit topology, comprising stacked power amplifier ladders arranged in a house-of-cards topology such that the number of stacked-domains follows a decaying triangular series N, N−1, N−2, . . . , N−i from the fixed ladder to the $i^{th}$ ladder to provide a 1: (i+1) voltage transformation ratio through voltage addition that is output via a flying domain power amplifier in each ladder and each ladder provides balancing of stacked domains of a prior ladder and combines power from all prior ladders, wherein each stacked power ladder amplifier comprises at least two power amplifier cells, at least one flying capacitor, and at least one flying power amplifier cell whose input is connected to a mid-rail DC voltage from the previous stage's ladder.

6. A circuit topology, comprising stacked power amplifier ladders arranged in a house-of-cards topology such that the number of stacked-domains follows a decaying triangular series N, N−1, N−2, . . . , N−i from the fixed ladder to the $i^{th}$ ladder to provide a 1: (i+1) voltage transformation ratio through voltage addition that is output via a flying domain power amplifier in each ladder and each ladder provides balancing of stacked domains of a prior ladder and combines power from all prior ladders, further comprising additional voltage transformation ratios generated by capacitively-combining the output of one or more house-of-card stages with either a different DC potential, or with another house-of-card stage set to a different voltage conversion ratio.

7. A circuit topology, comprising stacked power amplifier ladders arranged in a house-of-cards topology such that the number of stacked-domains follows a decaying triangular series N, N−1, N−2, . . . , N−i from the fixed ladder to the $i^{th}$ ladder to provide a 1: (i+1) voltage transformation ratio through voltage addition that is output via a flying domain power amplifier in each ladder and each ladder provides balancing of stacked domains of a prior ladder and combines power from all prior ladders further comprising a plurality of ladders capacitively switched such that each can be reconfigured between multiple voltage transformation ratios such that each ladder can be swapped to act as a peaking amplifier without wasting any silicon area.

8. A circuit topology, comprising:
- a stacked power amplifier ladder including a plurality of vertically stacked power amplifier cells;
- a flying domain power amplifier for outputting a voltage from each of the stacked power amplifier cells; and
- a switched-capacitor network arranged to connect a stack of N of the power amplifier cells to a stack of N−1 power amplifier cells in a decaying triangular series, wherein the switched-capacitor network switches to change a conversion ratio of the topology from a buck mode into a boost mode in response to a predetermined input voltage drop.

\* \* \* \* \*